US012748469B2

(12) United States Patent
Scott et al.

(10) Patent No.: US 12,748,469 B2
(45) Date of Patent: Sep. 29, 2026

(54) 3-WAY QUICK-DISCONNECT FLUID COUPLINGS WITH AUTOMATIC BYPASS SWITCHING

(71) Applicant: HEWLETT PACKARD ENTERPRISE DEVELOPMENT LP, Spring, TX (US)

(72) Inventors: Michael Dustin Scott, Chippewa Falls, WI (US); Corey Paul Knudsen, Elk Mound, WI (US); Harvey John Lunsman, Chippewa Falls, WI (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 306 days.

(21) Appl. No.: 18/621,996

(22) Filed: Mar. 29, 2024

(65) Prior Publication Data

US 2025/0306651 A1 Oct. 2, 2025

(51) Int. Cl.

| | |
|---|---|
| ***G06F 1/20*** | (2006.01) |
| ***F16K 11/07*** | (2006.01) |
| ***H05K 7/20*** | (2006.01) |

(52) U.S. Cl.

CPC ............ *G06F 1/20* (2013.01); *F16K 11/0716* (2013.01); *H05K 7/20327* (2013.01); *H05K 7/20809* (2013.01); *G06F 2200/201* (2013.01)

(58) Field of Classification Search

CPC . F16L 29/04; F16L 37/36; F16L 37/40; F16L 37/34; F16L 37/00; F16L 37/367; F16L 37/30; F16L 37/62; F16L 37/53; F16L 37/32; F16K 17/168; F16K 11/0716; H05K 7/20272; H05K 7/20772;

(Continued)

(56) References Cited

U.S. PATENT DOCUMENTS

| | | | | |
|---|---|---|---|---|
| 7,159,616 B2 * | 1/2007 | Watson | F16L 37/40 251/149.6 |
| 9,194,634 B2 * | 11/2015 | Tiberghien | F16L 37/34 |
| 10,188,016 B2 * | 1/2019 | Lunsman | H05K 7/20263 |

(Continued)

FOREIGN PATENT DOCUMENTS

EP 3252358 A1 12/2017

OTHER PUBLICATIONS

Extended European Search Report and Search Opinion received for EP Application No. 24186795.1, mailed on Dec. 13, 2024, 09 pages.

*Primary Examiner* — Mandeep S Buttar
(74) *Attorney, Agent, or Firm* — Jones Burke, PLLC

(57) ABSTRACT

A 3-way fluid coupling for an information processing device having a primary liquid cooling loop and an expansion space. When no expansion device is present, the coupling directs liquid down a bypass path of the primarily loop. When an expansion device is present in the expansion space, the coupling directs liquid to flow through an expansion liquid cooling loop of the expansion device while substantially blocking liquid from flowing through the bypass path. The 3-way fluid coupling has a body and a poppet in the body. The poppet moves between a first position, in which first and second ports of the body are open while a third port is closed, thus directing liquid along the bypass path, and a second position in which the first and third ports are open and the second port is blocked, thus directing liquid to the expansion loop and substantially blocking the bypass path.

9 Claims, 15 Drawing Sheets

(58) Field of Classification Search
CPC .. H05K 7/20763; H05K 7/20254; G06F 1/20; G06F 2200/201; G06F 1/206
See application file for complete search history.

(56) References Cited

U.S. PATENT DOCUMENTS

| | | | | |
|---|---|---|---|---|
| 11,864,305 | B2 * | 1/2024 | Gao | H05K 7/20272 |
| 11,980,008 | B2 * | 5/2024 | Gao | H05K 7/20781 |
| 2023/0092620 | A1 * | 3/2023 | Gao | H05K 7/1408 361/699 |

* cited by examiner

100

3-WAY QUICK-DISCONNECT FLUID COUPLINGS WITH AUTOMATIC BYPASS SWITCHING

INTRODUCTION

Information processing devices, such as computers and networking devices, generate heat when in use. Cooling systems may be utilized to remove heat from components of the information processing devices to keep them within desired operating temperatures. Cooling systems for information processing devices tend to utilize air cooling techniques, liquid cooling techniques, or a combination thereof. Air cooling techniques generally involve flowing air (e.g., via fan) through the system to remove heat therefrom. Liquid cooling techniques generally involve flowing liquid coolant through the system to remove heat therefrom. In particular, with some liquid cooling techniques, cold plates may be thermally coupled with heat generating components and flows of liquid coolant may be thermally coupled to the cold plates (e.g., by flowing through a channel in the cold plate) such that heat generated by the components is transferred into the liquid coolant via the cold plates.

In systems that utilize liquid cooling techniques, the flows of liquid coolant are delivered to the information processing devices via liquid cooling infrastructure such as pumps, coolant lines, fluid couplings, etc. In particular, quick-disconnect (QD) fluid couplings are commonly used to connect tubes or pipes to other components, such as another tube or pipe, a fluid manifold, a pump, or other infrastructure. A QD fluid coupling can be mated with a complementary QD fluid coupling and, when so mated, a fluid connection is established between the two QD fluid couplings.

BRIEF DESCRIPTION OF THE DRAWINGS

The present disclosure can be understood from the following detailed description, either alone or together with the accompanying drawings. The drawings are included to provide a further understanding of the present disclosure and are incorporated in and constitute a part of this specification. The drawings illustrate one or more examples of the present teachings and together with the description explain certain principles and operations. In the drawings.

Figure 1:
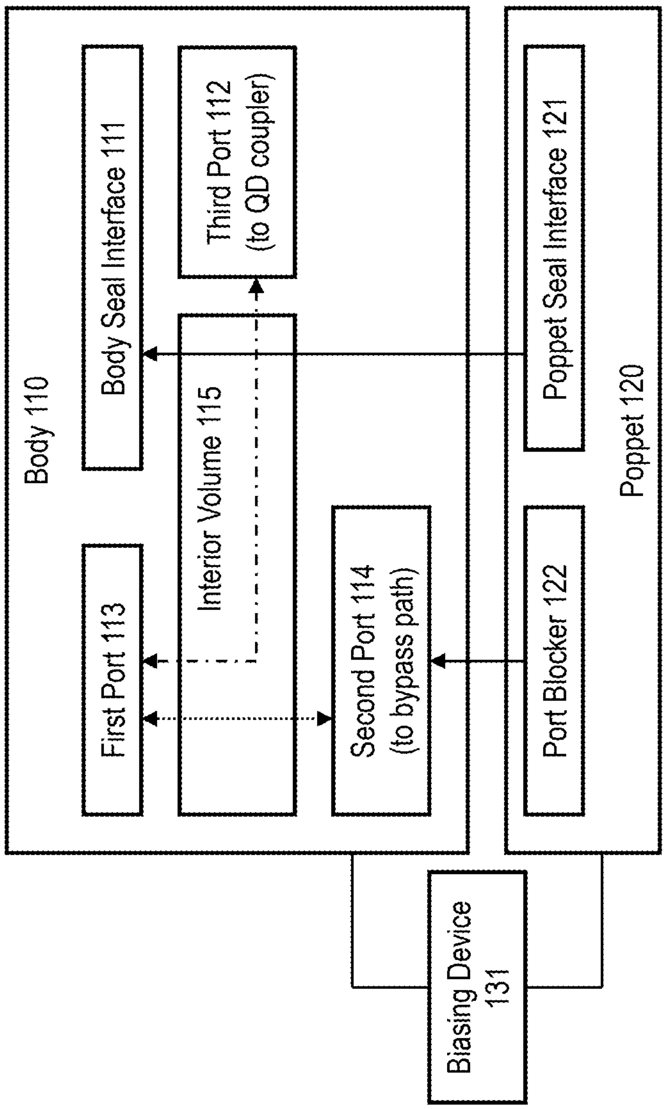
FIG. 1 is a block diagram illustrating an example 3-way fluid coupling.

In each of the sectional views, the section is taken along (i.e., the cutting plane extends along) a longitudinal centerline of the 3-way fluid coupling and complementary fluid coupling, with the longitudinal centerline being parallel to the proximal-distal axes depicted in the figures. Furthermore, cut surfaces are depicted by shading whereas uncut surfaces are not shaded.

DETAILED DESCRIPTION

Manufacturers of information processing devices generally try to offer a variety of system configurations to meet different user needs, and sometimes even the same model of information processing device may be offered in a variety of configurations. However, developing and producing different parts for all of these different configurations can be costly. To reduce these costs, a more modular approach may be used in which certain part designs are shared in common among multiple different system configurations. Specifically, certain core components, such as the chassis and the primary system board (e.g., motherboard), may be the same for multiple different system configurations. Although these system configurations may share the same core components, they may differ from one another in that they may include different combinations of expansion components. The expansion components may include any components which can be added to the core components to expand the functionality thereof, such as, for example: hot-pluggable storage drives, expansion cards such as graphics processing units (GPUs), optical transceivers, line cards, open-compute project (OCP) modules, or the like. By using the same core components among multiple system configurations, development, manufacturing, and logistical costs can be reduced. In addition, customizability and upgradability are facilitated by the ability to selectively combine the core components with a variety of expansion components.

Some information processing devices which use the modular approach described above may have a dedicated space in their chassis for housing certain core components, such as the primary system board, and another dedicated space in the chassis for housing the expansion components. The space for housing the core components may be referred to herein as the primary space and the space for housing the expansion components may be referred to herein as the expansion space.

When using air-cooling techniques, it is relatively straightforward to cool the expansion components of an information processing device. Generally, each system configuration will have fans arranged to flow air through the primary space to cool the core components therein. The expansion space can usually be arranged such that these existing airflows also pass through the expansion space, and therefore when an expansion component is added, the already existing airflows from the primary space can provide the expansion component with cooling.

However, when using liquid cooling techniques, cooling expansion components in an expansion space can be more difficult. Unlike air which can flow more-or-less freely throughout the information processing device, liquid coolant generally needs to be contained within a liquid cooling loop. Thus, to provide liquid cooling to the expansion space may require an extension of the liquid cooling loop into the expansion space. One way to bring liquid cooling into the expansion space is to use a liquid cooling loop which extends through both the primary space and the expansion space. This may require the design and manufacture of multiple different cooling loops, as each system configuration may need a different cooling loop configuration depending on which expansion components (if any) are included in the system—for example, different numbers, sizes, locations, and/or shapes of cold plates, and different plumbing schemes to service those cold plates, may be needed in order to cool different combinations of expansion components. But designing and manufacturing multiple different cooling loops can increase costs. Moreover, this approach may limit the ability of the user to change the system configuration after its manufacture, for example by changing the type of expansion components installed therein, because only some expansion components may be compatible with the currently installed liquid cooling loop. If the desired new expansion components do not work with the currently installed liquid cooling loop, then either the upgrade may need to be forgone or the entire liquid cooling loop may need to be replaced with a new liquid cooling loop compatible with the new configuration, which may be costly and complicated.

One way to reduce the costs of coolant loops while also allowing for easy customization and upgradability is to use a more modular approach in which a primary loop is disposed in the primary space and an expansion loop is selectively installed in the expansion space and removably coupled to the primary loop via a pair of fluid couplings, with the design of the primary loop being shared in common among multiple system configurations (i.e., the primary loop may be one of the core components). Different expansion loops can be designed for different expansion components or combinations thereof. Thus, a system can be customized by starting with the core components in the primary space (including the primary loop) which are common to multiple system configurations and then installing a desired set of expansion components (if any) with a corresponding expansion loop in the expansion space and coupling the expansion loop to the primary loop. Because the design of the primary loop is shared in common among multiple configurations, costs can be reduced. In addition, if no expansion components are provided, then the expansion loop can be omitted and therefore the cost and weight of liquid cooling infrastructure in the expansion space can be avoided. Moreover, changing the system configuration post manufacture may be easier and less costly, as the expansion loop can be easily removed from the system without disturbing the primary loop, and a new expansion loop which matches the new expansion components can be installed. This is less complicated and less costly than replacing the entire liquid cooling loop.

Some system configurations may comprise just the core components without any expansion components present, and thus it may be desired, in some circumstances, for the primary loop to be capable of functioning without any expansion loop present. To allow for the primary loop to function when no expansion loop is coupled thereto, a bypass path is generally provided between the pair of fluid couplings so that, when no expansion loop is coupled to the pair of fluid couplings, the primary loop is not broken. In other words, the primary loop may have a supply-side portion which is coupled to a liquid supply, a return side portion which is coupled to a liquid return, and a bypass portion which connects the supply portion to the return portion thus forming a complete loop between supply and return. One fluid coupling is coupled to the supply-side portion and the other fluid coupling is coupled to the return-side portion such that, when an expansion loop is coupled to the fluid couplings, the expansion loop is connected in parallel with the bypass path, i.e., they form two parallel branches of the overall flow path. As a result, the flow of liquid coolant from the supply-side portion of the primary loop splits between the bypass path and the expansion loop, and the rate of coolant flow through the expansion loop is thus some fraction of the overall flow rate through system. Specifically, if the bypass path and the expansion loop have similar characteristics (e.g., they present similar impedance to fluid flow), then the flow of liquid coolant will split equally between the expansion loop and the bypass path and they will each have a flow rate of one-half the overall flow rate. If the expansion loop has a greater impedance to flow (which is often the case), then the division of the flow will be skewed in favor of the bypass path, resulting in even lower flow rates through the expansion loop. This may result in flow rates through the expansion loop which are inadequate to provide the desired level of cooling to the expansion components.

To address the issues described above, examples disclosed herein provide modular liquid cooling infrastructures comprising 3-way fluid couplings for selectively coupling an expansion loop in an expansion space of an information processing device to a primary loop in a primary space of the information processing device. At least one pair of the 3-way fluid couplings is coupled to the primary loop, with a bypass path coupled to and extending between each pair of 3-way fluid couplings. Moreover, the 3-way fluid couplings are configured to be removably mated with complementary fluid couplings of an expansion loop (if an expansion loop is installed). Each pair of 3-way fluid coupling is configured to automatically switch between two states based on whether a corresponding expansion loop is coupled to the primary loop, i.e., based on whether complementary fluid couplings are mated with the pair of 3-way fluid couplings: (1) an expansion-present state in which the expansion loop is coupled to the primary loop and the 3-way fluid couplings allow liquid to flow between the primary loop and the expansion loop while restricting liquid flow down the bypass path, and (2) an expansion-absent state in which the 3-way fluid couplings direct the full flow of liquid through the bypass path. The automatic switching between these states may be referred to herein as automatic bypass switching. These 3-way fluid couplings allow for improved coolant flow rates through the expansion loop when one is present. Specifically, by fully or partially blocking off the bypass path when an expansion loop is connected, a greater proportion of the overall flow is diverted down the expansion path than would have otherwise been the case (in some cases, all of the liquid flow is diverted down the expansion path). On the other hand, when no expansion space is present, the bypass path is fully opened and all of the liquid coolant flows through the bypass, allowing the primary loop to function. In this manner, the problem of insufficient liquid flow rates through the expansion loop due to the splitting of liquid flows with the bypass path can be avoided.

As noted above, the 3-way fluid couplings are configured to automatically switch between the two states based on whether a complementary fluid coupling of an expansion loop is coupled thereto. Specifically, in some examples, as the complementary fluid couplings mate with the 3-way fluid couplings, the force supplied by the user to push the couplings together also causes the 3-way fluid couplings to change from the expansion-absent state to the expansion-present state (or in other words, the motion of the 3-way fluid coupling and the complementary fluid couplings causes the change in states). Conversely, as the complementary fluid couplings are decoupled, a biasing force in the 3-way fluid couplings causes them to change from the expansion state to the no-expansion state. In this manner, the person installing or removing the expansion loop does not need to take any separate actions (such as manually actuating bypass valves) to switch between the two states, which simplifies the installation process for the person. In addition, because the switching is automatic, the likelihood of user errors, such as forgetting to manually open a bypass valve after removing an expansion loop or forgetting to manually close a bypass valve after adding an expansion loop, can be reduced.

Furthermore, in some examples, the automatic switching between the states is based on purely mechanical forces, which act automatically in reaction to the coupling/decoupling of the fluid couplings. More specifically, a portion of the force which is supplied by the user to achieve the mating of the fluid couplings is mechanically transferred to parts inside the fluid couplings to change the states. In other words, the motion of moving the fluid couplings together mechanically causes both the mating of the fluid couplings and the changing of states, without any separate user actions being needed. This may allow for increased reliability and decreased costs when compared to an alternative system which might achieve bypass switching through electronically sensing installation of the expansion loop and electronically controlling a bypass valve to switch closed or open the bypass path.

In some examples, each 3-way fluid coupling comprises a body which defines an interior volume and three ports in the body which communicate with the interior volume and with one another via the interior volume. These ports include first and second ports configured to be fluidically coupled to portions of the primary loop and a third port configured to be removably coupled to the expansion loop via a complementary fluid coupling mated with the 3-way fluid coupling. The 3-way fluid couplings are coupled together in series between a supply portion and a return portion of the primary loop via one or more bypass portions coupled to the first and/or second ports. The bypass portions collectively form a bypass path which connects a supply side of the primary loop to a return side of the primary loop. For each pair of 3-way fluid couplings, a corresponding bypass portion extends between and is fluidically coupled to the second ports of the two couplings. If only a single pair of 3-way fluid couplings are present, then this may be the sole bypass portion and the first ports of the 3-way fluid couplings may be coupled to the supply portion and return portion, respectively, of the primary loop. If more than one pair of 3-way fluid couplings is present, then additional intermediate bypass portions may connect adjacent pairs of fluid couplings together, with the additional intermediate bypass portions being connected to first ports of the fluid couplings. In this manner, a bypass flow path is established from the supply portion to the return portion via the first and second ports of the 3-way fluid couplings and the one or more bypass portions coupled thereto.

The 3-way fluid coupling may also comprise a poppet disposed in the interior volume, which is moveable between two positions. In a first position of the poppet, the poppet closes (blocks liquid flow through) the third port while leaving the first and second ports open, thus allowing for the full flow of liquid received from the supply portion of the primary loop to flow between the first and second ports. In other words, the first position of the poppet corresponds to the expansion-absent state, and in this position the 3-way fluid coupling allows the full flow of liquid received from the supply portion to flow through the bypass path while no liquid flows to the expansion loop. In a second position of the poppet, the poppet at least partially closes (i.e., at least partially blocks) the second port while leaving the first and third ports open, thus allowing for most or all of the liquid received from the supply portion of the primary loop to flow between the first and third ports, while allowing less or no liquid to flow through the second port. In other words, the second position of the poppet corresponds to the expansion-present state, and in this position the 3-way fluid coupling allows most or all of the liquid received from the supply portion to flow to the expansion loop while less or no liquid flows through the bypass path.

The 3-way fluid coupling may also comprise a biasing element, such as a spring, magnet, etc., which biases the poppet towards the first position, i.e., applies a biasing force to the poppet which urges the poppet towards the first position. Thus, the first position is the default position for the poppet, meaning the position that the poppet naturally assumes when no external forces are applied to it. The poppet is moved to the second position when a countervailing force is applied to the poppet which is large enough to overcome the biasing force. This countervailing force may be provided by the complementary fluid coupling, which comes into contact with the poppet during a mating sequence between the complementary fluid coupling and the 3-way fluid coupling. In other words, during the mating of the complementary fluid coupling and the 3-way fluid coupling, some of the force supplied by the user to push the couplings together is transferred to the poppet and pushes it to the second position. Conversely, as the fluid couplings are decoupled, the movement of complementary fluid away from the 3-way fluid coupling releases the poppet and allows the biasing force to move the poppet back to the first position.

As noted above, in some examples all of the flow of liquid through the bypass path is blocked by the poppet in the expansion-present state, while in other examples some small amount of liquid may be allowed to flow through the bypass path in the expansion-present state. In examples that allow a small amount of liquid to flow down the bypass path, a portion of the poppet which blocks the second port may have a small aperture therein to allow a small flow of liquid down the bypass path. This may be done in cases in which the bypass path is intended to provide cooling to some components positioned along the bypass path. The aperture may be calibrated to provide a desired balance between the flow rates through the expansion loop and the bypass path. Specifically, the aperture may be sized such that the flow through the bypass path is large enough to provide the needed cooling to the components cooled by the bypass path but small enough that the flow rate of the expansion loop remains high. In other words, in some examples, the aperture is small enough that most of the liquid flowing through the 3-way fluid coupling flows through the expansion loop.

These and other examples will be described in greater detail below in relation to FIGS. 1-19.

Figure 3:
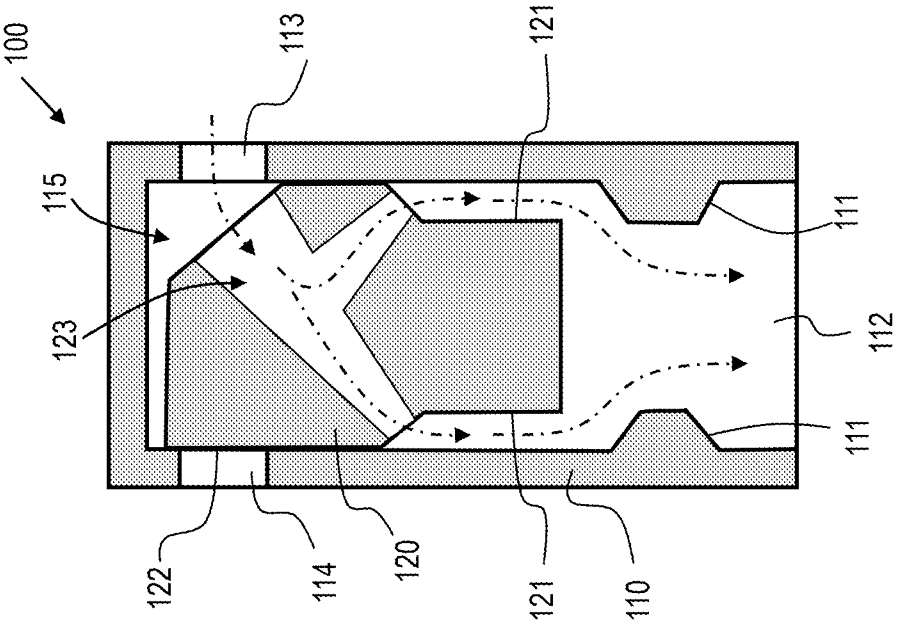
FIG. 3 is a schematic diagram illustrating the 3-way fluid coupling of FIG. 1 in an expansion-present state.
Figure 3:
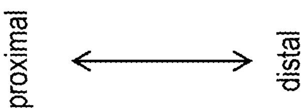
Figure 2:
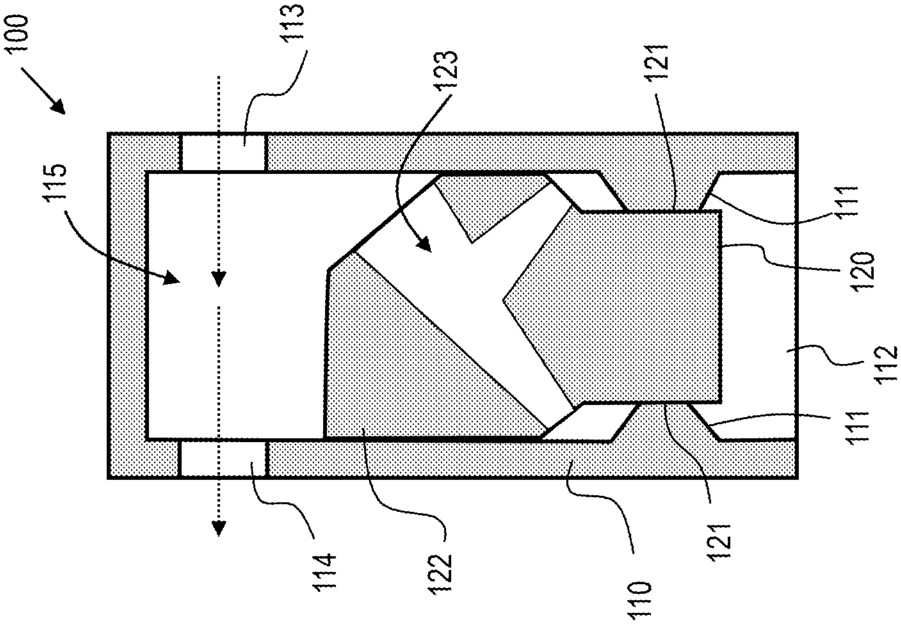
FIG. 2 is a schematic diagram illustrating the 3-way fluid coupling of FIG. 1 in an expansion-absent state.

FIGS. 1-3 illustrate an example 3-way fluid coupling 100. FIGS. 1-3 are schematic in nature and are not intended to illustrate shapes, sizes, or other structural details accurately or to scale. Components which are not illustrated in FIGS. 1-3 may also be included in the 3-way fluid coupling 100 or one or more components illustrated in FIG. 1 may be omitted from the 3-way fluid coupling 100. In FIG. 1, physical connections or engagements are indicated conceptually by solid lines, while fluidic connections and fluid flow paths are indicated conceptually by dotted lines and dot-dashed lines. In FIGS. 2 and 3, liquid flow paths are indicated by dotted and dot-dashed lines.

The fluid coupling 100 may comprise, for example, a QD fluid coupling which can be used in a liquid cooling loop for cooling an electronic device. As shown in FIG. 1, the fluid coupling comprises a body 110 and a poppet 120 coupled to the main body 110. As shown in FIGS. 1-3, the body 110 has a generally tubular shape with a central cavity defining an interior volume 115 through which liquid can flow. The body 110 may define a coupling interface which may mate with a complementary fluid coupling—for example, a distal end of the body 110 may be received within a central bore of the complementary fluid coupling when mated. The coupling interface comprises a QD interface, as would be familiar to those of ordinary skill in the art.

At a proximal end portion of the body 110, a first port 113 and a second port 114 are provided. The first and second ports 113, 114 are fluidically coupled to the interior volume 115 and are configured to be coupled to the primary loop of an information processing device. Note that, although FIGS. 2 and 3 appear to depict the ports 113, 114 in lateral walls of the body 110, FIGS. 2 and 3 are not intended to accurately depict the locations of the ports 113, 114 aside from showing that they are generally located in the proximal end portion of the body 110. In some examples, the ports 113, 114 may be disposed in lateral walls of the body 110 and face laterally (e.g., see FIG. 12), while in other examples one or more of the ports 113, 114 may be disposed at a proximal end of the body 110 and face proximally (e.g., see FIG. 18). The first and second ports 113, 114 may comprise, or may be fluidically coupled to, connectors/fitting configured to allow connection of the ports 113, 114 to external liquid cooling infrastructure (e.g., pipes/tubes of the primary loop). Examples of such connections include a hose barb connection, a threaded connection (male or female), a compression fitting, a push-to-connect fitting, a Yor-Lok fitting, an O-ring face seal fitting, a solder-connect fitting, or any other connectors/fittings. At a distal end portion of the body 110, a third port 113 is provided. The third port 112 is also fluidically coupled to the interior volume 115 and is configured to be coupled to a complementary fluid coupling.

The poppet 120 is disposed in the interior volume 115 and is movable therein between first and second positions, which are depicted schematically in FIGS. 2 and 3, respectively. In the first position of the poppet 120 (FIG. 2), the poppet 120 closes (blocks liquid flow through) the third port 112 while leaving the first and second ports 113, 114 open. Thus, in the first position the poppet 120 allows for the full flow of liquid received from the supply portion of the primary loop to flow between the first and second ports 113, 114, as indicated by the dotted lines in FIGS. 1 and 2. (Although FIG. 2 shows the fluid flowing in one direction as an example, the fluid could flow along the same path in the opposite direction, depending on how the fluid coupling 100 is coupled to the primary cooling loop). In other words, the first position of the poppet 120 corresponds to the expansion-absent state, and in this position the 3-way fluid coupling 100 allows the full flow of liquid received from the supply portion to flow through the bypass path while none flows to the expansion loop.

Figure 4:
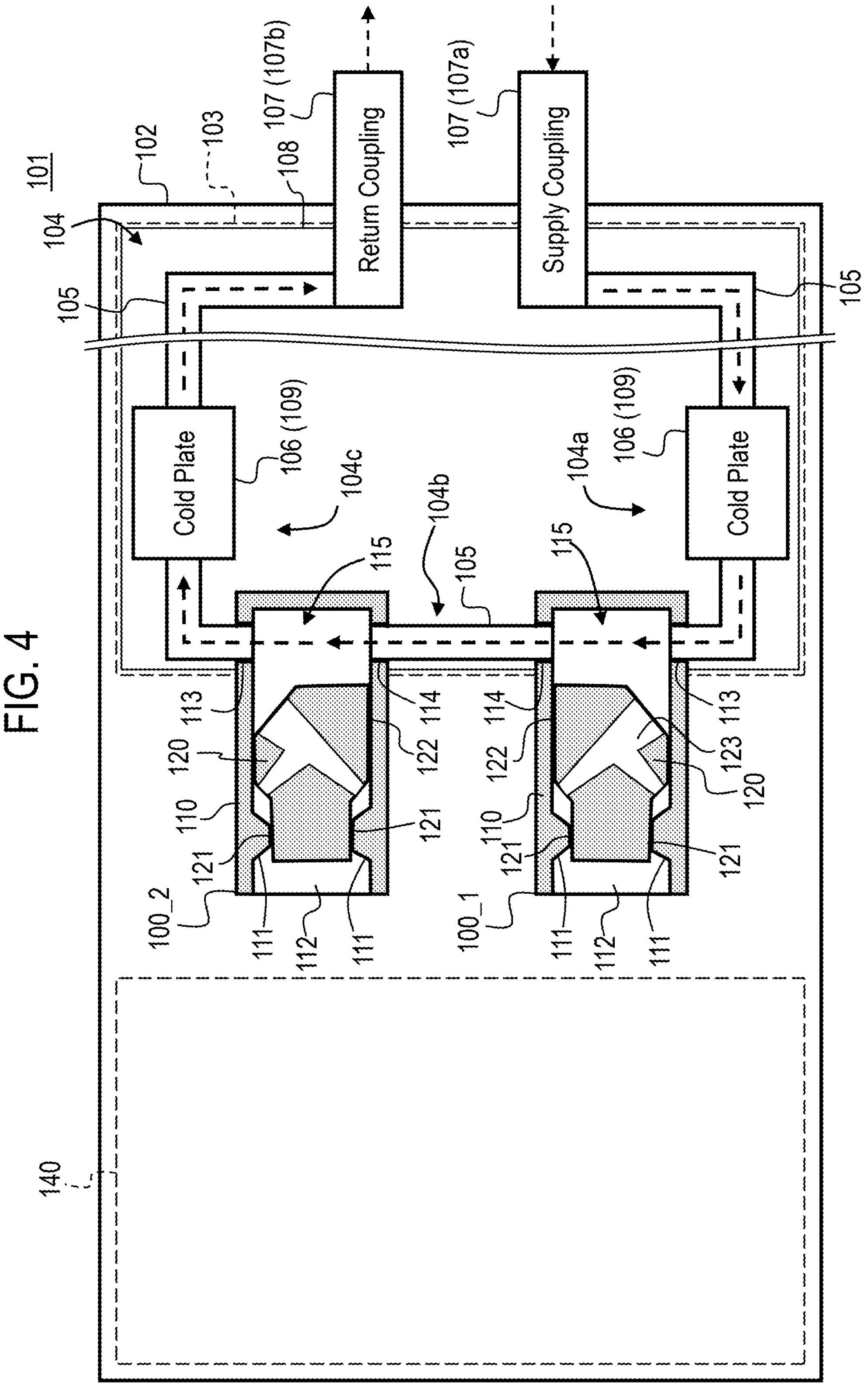
FIG. 4 is a schematic diagram illustrating an example information processing device comprising an expansion space with no expansion device installed and two of the 3-way fluid couplings of FIG. 1 in the expansion-absent state.

In a second position of the poppet 120 (FIG. 3), the poppet 120 at least partially closes (i.e., at least partially blocks) the second port 114 while leaving the first port 113 and third port 112 open. Thus, in the second position the poppet 120 allows for most or all of the liquid received from the supply portion of the primary loop to flow between the first port 113 and third port 112, as indicated by the dot-dashed line in FIG. 1 and FIG. 3. (Although FIG. 4 shows the fluid flowing in one direction as an example, the fluid could flow along the same path in the opposite direction, depending on how the fluid coupling 100 is coupled to the primary cooling loop). In the second position, the poppet 120 at least partially blocks the second port 114 and thus allows less or no liquid to flow through the second port 114. In other words, the second position of the poppet 120 corresponds to the expansion-present state, and in this position the 3-way fluid coupling 100 allows most or all of the liquid received from the supply portion to flow to the expansion loop while less or no liquid flows through the bypass path.

More specifically, the poppet 120 comprises a port blocker 122 which at least partially blocks the second port 114 when the poppet 120 is in the second position but which does not cover or block the second port 114 when the poppet 120 is in the first position. In some examples, the second port 114 may comprise an aperture in a radially outer wall (e.g., circumferential wall) of the body 110 and the port blocker 122 may comprise a radially outer surface (e.g., circumferential surface) of the poppet 120 which slides along and contacts an inner surface of the radially outer wall of the body 110. The port blocker 122 may thus block the second port 114 by covering the aperture. In some examples, the port block 112 may allow a calibrated leak through the second port 114 even when blocking the second port 114. In some examples, this leak may be provided by a small aperture in the port blocker 112.

In addition, the poppet 120 may comprise a poppet seal interface 121 which is configured to engage with a body seal interface 111 of the body 110 when the poppet 120 is in the first position, with the engagement closing the third port 112. The poppet seal interface 121 disengages from the body seal interface 111 when the poppet 120 is in the second position, thus opening the third port 112. In some examples, the poppet seal interface 121 comprises a radially outward facing surface of the poppet and the body seal interface 111 comprises a radially inward facing surface of the body 110 inside the interior volume 115. The poppet seal interface 112 and/or the body seal interface 111 may comprise compliant sealing features, such as O-rings, which are contacted and compressed when the poppet seal interface 121 engages with the body seal interface 111 thus forming a water-tight seal.

As shown in FIGS. 2 and 3, in some examples there may be channels 123 which extend through and/or around the poppet 120 to fluidically connect the proximal end portion of the interior volume 115 with the distal end portion of the interior volume 115, i.e., to fluidically connect first port 113 with third port 112.

Note that FIGS. 2 and 3 are not intended to accurately depict the shape of the poppet 120 or its various constituent parts, such as the port blocker 122 or poppet channel 123. Instead, FIGS. 2 and 3 are intended to conceptually illustrate the poppet 120 and its interactions with the body 110. FIGS. 10-19, which are described below, illustrate some non-limiting examples of poppets having specific shapes which may be used as the poppet 120.

As shown in FIG. 1, the 3-way fluid coupling 100 may comprise a biasing device 131 which biases the poppet 120 toward the first position. (The biasing device 131 is omitted from FIGS. 2 and 3 to avoid obscuring other items). The biasing device 131 may be, for example, a spring which is coupled between the poppet and the body 110 inside the interior volume 115. As another example, the biasing device 131 may be a magnet which attracts or repels the poppet 120.

Turning now to FIGS. 4-9, example information processing devices 101 and 201 which utilize the 3-way fluid couplings 100 of FIGS. 1-3 will now be described. FIGS. 4-9 are schematic in nature, and are not intended to illustrate specific shapes, sizes, or other structures accurately or to scale.

Figure 5:
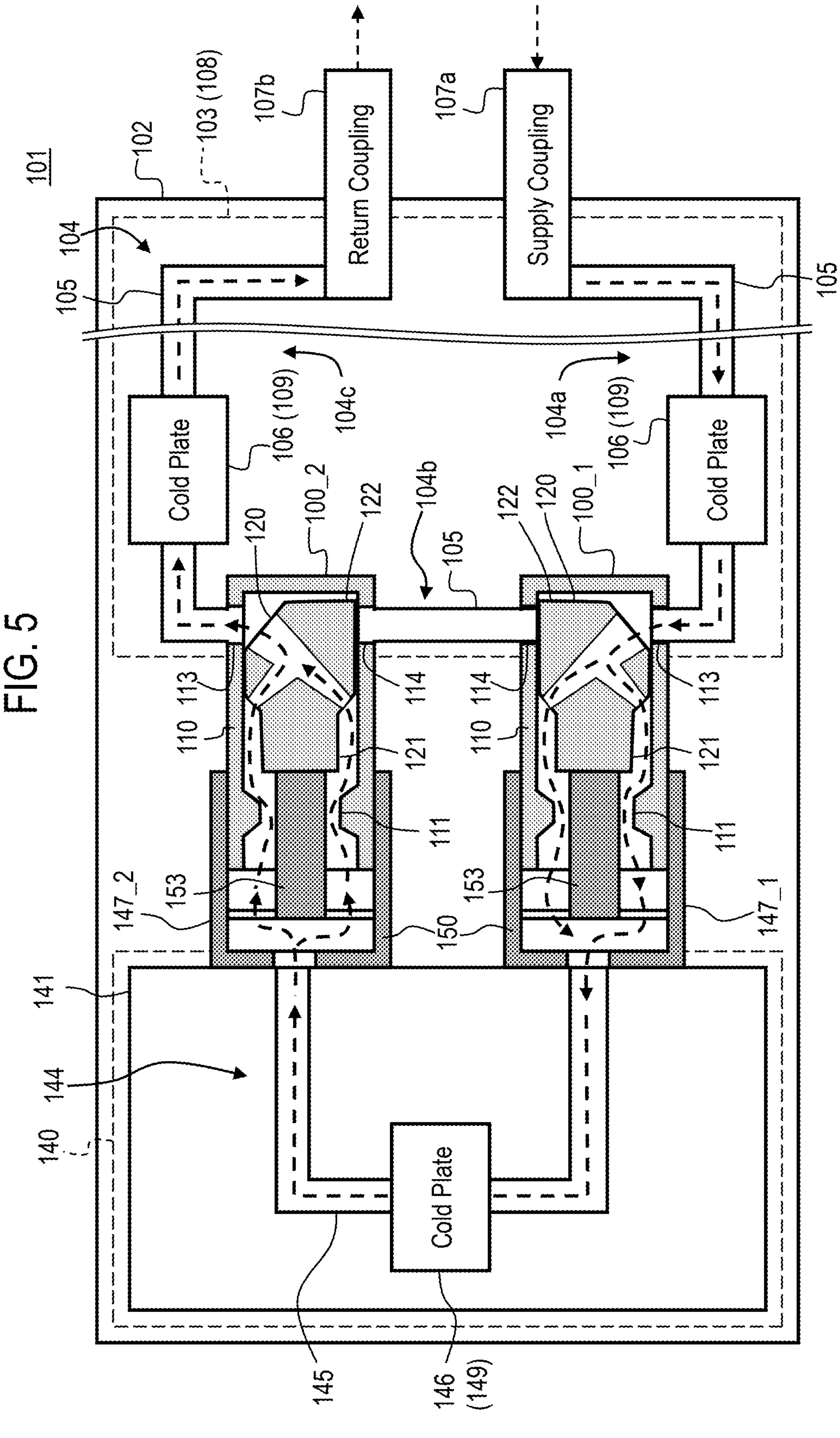
FIG. 5 is a schematic diagram illustrating the information processing device of FIG. 4 with an expansion device installed in the expansion space and the 3-way fluid couplings in the expansion-present state.

FIGS. 4 and 5 illustrate a first information processing device 101 which utilizes the 3-way fluid couplings 100. The device 101 comprises chassis 102 which comprises a primary space 103 and an expansion space 140. The primary space 103 comprises certain electrical components of the device 101 which are shared among multiple different configurations of the device 101. These electrical components may include a primary system board 108 (e.g., motherboard), one or more processor nodes 109 mounted on the primary system board 108, each comprising or being configured to receive a processor, and/or other electronic components as would be familiar to those of ordinary skill in the art. (The processor nodes 109 are covered by the cold plates 106 in FIGS. 4 and 5). In addition, the information processing device 101 comprises a primary liquid cooling loop 104 disposed in the primary space 103. The primary loop 104 comprises tubes/pipes 105, cold plates 106, and other liquid cooling infrastructure which cools the components in the primary space 103. For example, cold plates 106 may be thermally coupled to the processor nodes 109. Additional cold plates (not illustrated) may be thermally coupled to other components. Although two cold plates 106 covering two processor nodes 109 are illustrated, this is just one example and any number of cold plates 106 and/or processor nodes 109 may be provided.

The primary loop 104 may also comprise fluid couplings 107 to connect the primary loop 104 into a larger liquid cooling system, such as a liquid cooling system which supplies liquid cooling to multiple information processing devices. The fluid couplings 107 may comprise any fluid couplings, such as QD fluid couplings. The couplings 107 may include a supply coupling 107*a* which receives liquid coolant supplied from the external liquid cooling system and a return coupling 107*b* which returns the warmed liquid coolant to the external system.

The primary loop 104 also comprises a pair of the 3-way fluid couplings 100 (i.e., fluid couplings 100_1 and 100_2). The portion of the primary loop 104 which extends between supply coupling 107*a* and the fluid coupling 100_1 may be referred to herein as a supply portion 104*a* of the primary loop 104, a portion which extends between the fluid couplings 100_1 and 100_2 may be referred to herein as a bypass portion 104*b*, and the portion which extends between the fluid coupling 100_2 and the return coupling 107*b* and may be referred to herein as a return portion 104*c*. As shown in FIG. 4, the first port 113 of the first fluid coupling 100_1 is coupled to the supply portion 104*a*, the second ports 114 of both fluid couplings 100_1 and 100_2 are coupled to the bypass 104*b*, and the first port 113 of the second fluid coupling 100_2 is coupled to the return portion 104*c*. Note that the fluid couplings 100_1 and 100_2 may be identical but may have reversed orientations relative to one another in FIG. 4 such that their second ports 114 are facing one another.

The information processing device 101 also comprises an expansion space 140 configured to receive expansion devices. The information processing device 101 is capable of being selectively configured into multiple configurations based on whether an expansion devices are installed in the expansion space 140. That is, the same chassis 102, primary system board 108, primary loop 104, and other core components may be shared in common by these multiple configurations, but by combining different combinations of expansion devices (or no expansion devices) with these core components different system configurations may be achieved. FIG. 4 illustrates one such configuration in which no expansion devices are installed in the expansion space 140. FIG. 5 illustrates another such configuration, in which an expansion module 141 is installed in expansion space 141. It should be understood that, in some examples, multiple different types of expansion devices could be selectively installed in the expansion space 140, and that the expansion module 141 is merely one example meant to schematically represent these expansion devices as a group.

The expansion module 141 may comprise one or more multiple expansion devices 149 and an expansion liquid cooling loop 144 which cools the expansion device(s) 149. The expansion loop 144 may comprise tubes/pipes 145, a cold plate 146 thermally coupled with the expansion devices 149, or any other liquid cooling infrastructure configured to cool the expansion devices 149. In addition, the expansion loop 144 comprises a pair of fluid couplings 147 (i.e., fluid couplings 147_1 and 147_2). The fluid couplings 147 are complementary to the 3-way fluid couplings 100 and are arranged to mate therewith when the expansion module 141 is installed in the expansion space 140. In some examples, the expansion module 141 comprises a single package or unit which integrates the expansion devices 149 and the expansion loop 144 together in one package, but in other examples the expansion devices and expansion loop could be installed as discrete (separate) units.

As shown in FIG. 4, in a state in which no expansion module is installed, the fluid couplings 100 are in the expansion-absent state, and thus liquid coolant flowing through the primary loop 104 is directed by the fluid couplings 100 through the bypass **104*b*. Specifically, in this state, the poppets 120 are held in the first position by the biasing force, thus blocking ports 112 while keeping ports 113 and 114** open.

In contrast, as shown in FIG. 5, when the expansion module 141 is installed, the fluid couplings 100 are in the expansion-absent state, and therefore the liquid coolant flowing through the primary loop 104 is directed by the fluid couplings 100 to flow through the expansion loop 144 via the fluid couplings 147. The mating between the 3-way fluid couplings 100 and the complementary fluid couplings 147 forces the poppets 120 to the second position, in which the second ports 114 are at least partially blocked while ports 112 are opened. In some examples, each complementary fluid coupling 147 may comprise a body 150 defining an internal volume (bore) and a plunger 153 which is fixed to the body 150 inside the internal volume and which extends along a central axis thereof. Liquid flows through the coupling 147 by flowing around the plunger 153. During mating of the fluid couplings 147 and the fluid couplings 100, the body 110 of the fluid couplings 100 is received within the internal volume of the body 150 of the fluid couplings 147, and the plungers 153 are received within the internal volume 115 of the body 110. As the couplings 147 and 100 are pushed together, the plungers 153 extend into the interior space 115 of the fluid couplings 110, contact the poppets 120, and force the poppets 120 to move axially to the second position. The fluid couplings 147 may also comprise poppets (not illustrated) which could seal off the fluid couplings 147 when not coupled to the fluid couplings 110 to prevent leakage, as would be familiar to those of ordinary skill in the art.

Thus, the fluid couplings 100 automatically switch between the expansion-absent and expansion-present states based on whether an expansion device is installed (more specifically, based on whether fluid couplings 147 have mated with the fluid couplings 100). As used herein, an action or state occurs automatically in response to a stated condition when the action or state occurs without requiring some additional user input. For example, if a hypothetical fluid coupling had a lever which needed to be actuated in order to switch the bypass path, then the switching of the bypass path in that case would not be "automatic" in response to the mating of the fluid couplings because an additional input—the act of a user actuating the lever—is required in addition to the act of mating of the fluid couplings. In contrast, in examples disclosed herein, a single user action of moving the fluid couplings together simultaneously achieves the mating of the fluid couplings and causes the switching of the bypass path, and thus the switching of the bypass path occurs automatically in response to the mating.

In some examples, the port blocker 122 has a small leak hole to allow for a calibrated leak to flow through the second port 114 and along the bypass path **104*b* when in the expansion-present state. In other examples, the port blocker 122** does not have any such leak hole.

In those examples with no calibrated leak, in the expansion-present state all of the liquid flowing through the primary loop 104 flows through the expansion loop 144 and none flows through the bypass path **104*b*. Thus, a flow rate through the expansion loop 144 can be maximized. In contrast, in approaches which lack the fluid coupling 100, the bypass path is open and therefore the flow of liquid would be split between the expansion loop 144 and the bypass path 104*b*. Specifically, the expansion loop 144 may receive about half of the overall flow if equal impedances are assumed, or less than half of the overall flow if the expansion loop 114 has a higher impedance. This may result in the expansion devices 149 receiving insufficient cooling in some cases. The three-way fluid couplings 100 with no calibrated leak avoid this problem by ensuring that all of the liquid coolant flows down the expansion loop 144** when the expansion devices are installed.

Moreover, even in those examples in which a calibrated leak through port 114 is provided in the expansion-present state, the fluid couplings 100 still can ensure that the flow rate of liquid directed down the expansion loop 144 is greater than the flow rate of liquid directed down the bypass path **104*b*. The leak hole provided is relatively small compared to the ports 112, 113, and 114 and thus creates a relatively high impedance to flow through the second port 114. This impedance may be greater than the impedance of flow through the expansion loop 144 and thus most of the liquid coolant will flow through the expansion loop 144 and only a small proportion will flow through the bypass path 104*b*. Thus, the three-way fluid couplings 100 with a calibrated leak can also avoid the problem of insufficient cooling for the expansion devices by ensuring that more (in some cases, most) of the liquid coolant flows down the expansion loop 144** when the expansion devices are installed.

In FIGS. 4 and 5, the information processing device 101 comprises just one pair of 3-way fluid couplings 100 configured to supply cooling to a single expansion module 141. However, the same principles apply to systems which have multiple expansion modules 141. For example, FIGS. 6-9 illustrate an example information processing device 201 comprising multiple expansion spaces 240 to receive multiple expansion modules 241. The information processing device 201 may have some components which are the same as those of the information processing device 100 described above, and these components may be given the similar reference numbers having the same last two digits, such as 103 and 203.

Specifically, the information processing device 201 may comprise a chassis (not illustrated) comprising a primary space 203 (similar to primary space 103) and multiple expansion spaces 240 (two expansion spaces 240_1 and 240_2 are illustrated as examples). The expansion spaces 240_1 and 240_2 could be physically separated from one another or they could be formed as contiguous parts of one larger space. The primary space 203 has various electronic component (not illustrated) similar to those discussed above, as well as a primary liquid cooling loop 204. The primary loop 204 may comprise couplings **207*a* and 207*b* and other liquid cooling infrastructure such as tube/pips, cold plates, and the like similar to those described above—some of these are not illustrated or labeled in FIGS. 6-9 to avoid obscuring other elements. The primary loop 204 has a supply portion 204*a* and a return portion 204*c* similar to those described above. The primary loop 204 also comprises bypass portions 204*b* similar to the bypass portion 104 described above, except that in the deice 201 there are multiple bypass portions 204*b*, i.e., one for each pair of 3-way fluid couplings 100. In addition, the primary loop 204 comprises one or more additional intermediate bypass portions 204*d*, with each intermediate bypass portion 204*d* coupling one pair of fluid couplings 100 to an adjacent pair of fluid couplings 100. Specifically, in FIGS. 6-9 there are two pairs of fluid couplings 100 illustrated, and thus there are two bypass portion 204*b*_1 and 204*b*_2 and one additional intermediate bypass portion 204*d*. The bypass portions 204*b* may also be referred to as intra-pair bypass portions 204*b* because they connect two fluid couplings 100 of the same pair to one another, whereas the bypass portions 204***d* may be referred to as inter-pair bypass portions 204*d* because they connect two pairs to one another. Liquid coolant always flows though the inter-pair bypass portions 204*d* regardless of whether expansion devices are installed, whereas the flow of liquid coolant through the intra-pair bypass portions 204*b* is automatically switched between high and low (in some cases, zero) flow rates by the fluid couplings 100 depending on whether expansion devices are installed. In other words, the automatic bypass switching described herein relates to switching the intra-pair bypass portions 204*b* and not the inter-pair bypass portions 204*d*.

Figure 6:
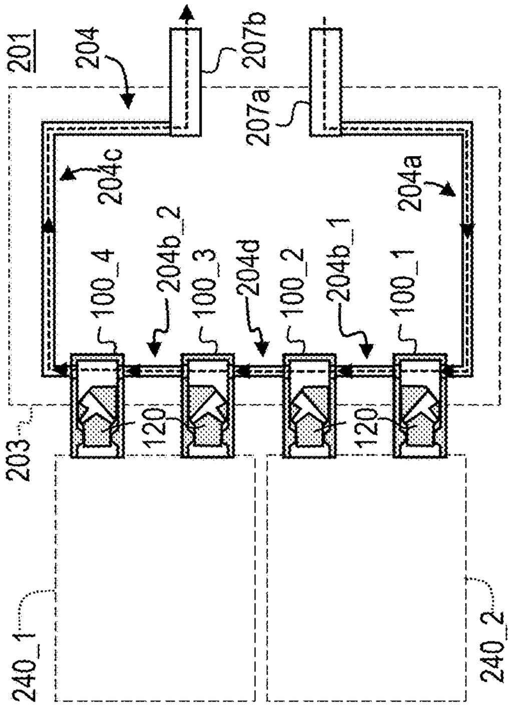
FIG. 6 is a schematic diagram illustrating another example information processing device comprising two expansion spaces with no expansion devices present and four of the 3-way fluid couplings of FIG. 1 in the expansion-absent state.

The fluid couplings 100 and the bypass portions 204*b* and 204*d* are coupled together in series via the second ports 114 of the fluid couplings 100 such that, when no expansion devices are installed and the fluid couplings are in the expansion-absent state, the bypass portions 204*b* and 204*d* form a bypass path connecting the supply portion 204*a* to the return portion 204*b* such that liquid coolant can flow through primary loop 204, as shown in FIG. 6.

Figure 7:
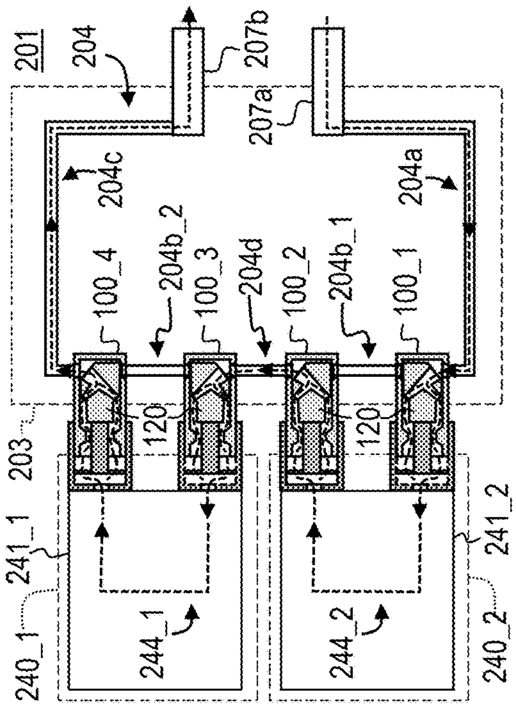
FIG. 7 is a schematic diagram illustrating the example information processing device of FIG. 6 with two expansion devices present in the expansion spaces and the 3-way fluid couplings in the expansion-present state.

As shown in FIG. 7, if expansion modules 241 are installed in all of the expansion spaces 240 (e.g., expansion modules 241_1 and 241_2 installed in expansion spaces 240_1 and 240_2), then all of the fluid couplings 100 are moved to the expansion-present state, their second ports 114 are (at least partially) blocked, and the liquid coolant is directed to flow through expansion loops 244 of the expansion spaces. Moreover, liquid coolant does not flow through the bypass path 204*b* (or flows at a substantially reduced rate, in cases in which a calibrated leak is provided). Liquid coolant also flows through the additional bypass portions 204*d* which couple the pairs of fluid couplings 100 together.

Figure 8:
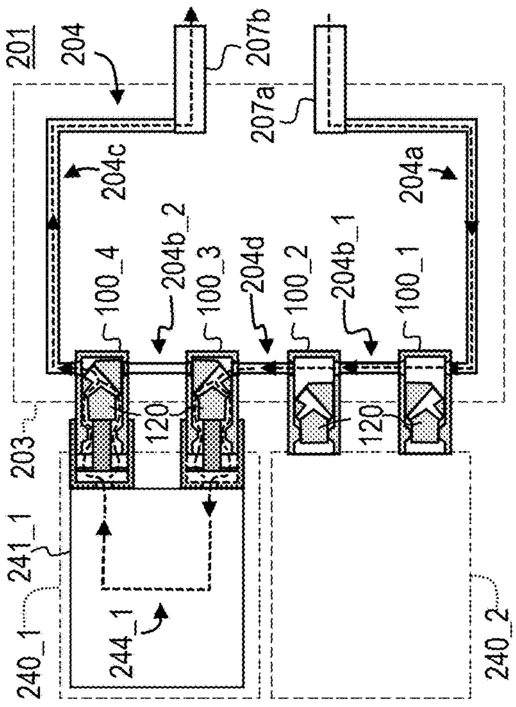
FIG. 8 is a schematic diagram illustrating the example information processing device of FIG. 6 with a first expansion device present in a first expansion space and a corresponding pair of the 3-way fluid couplings in the expansion-present state while the other 3-way fluid couplings are in the expansion-absent state.
Figure 9:
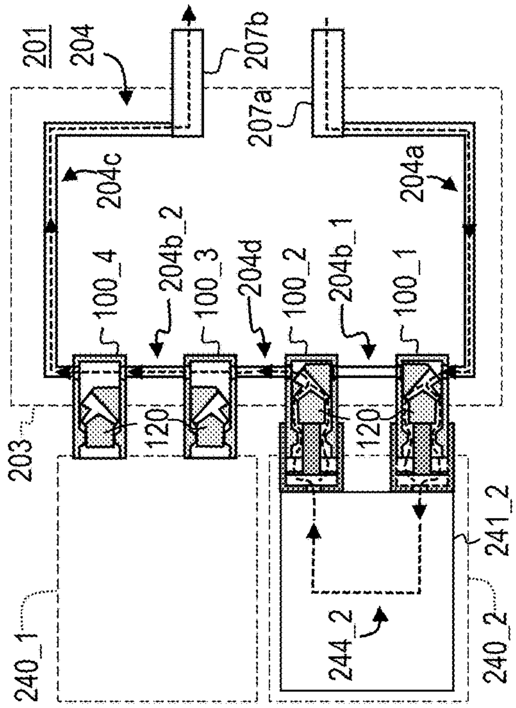
FIG. 9 is a schematic diagram illustrating the example information processing device of FIG. 6 with a second expansion device present in a second expansion space and a corresponding pair of the 3-way fluid couplings in the expansion-present state while the other 3-way fluid couplings are in the expansion-absent state.

As shown in FIGS. 8 and 9, if expansion modules 241 are installed in some expansion spaces 240 but not in others, then liquid will flow through expansion loops 244 of the expansion modules 240 that are present while flowing through the bypass portions 204*b* for those fluid couplings 100 which are not coupled to an expansion module. For example, in FIG. 8, an expansion module 241_1 is installed in expansion space 240_1 while expansion space 240_2 is empty, and therefore fluid couplings 100_1 and 100_2 are in the expansion-absent state and fluid couplings 100_3 and 100_4 are in the expansion-present state, which means that liquid flows from supply portion 204*a* through the bypass portion 204*b*_1 and into additional bypass portion 204*d* via couplings 100_1 and 100_2, into the expansion loop 244_1 via coupling 100_3, and then into return portion 204*c* via coupling 100_4. As another example, in FIG. 9, an expansion module 241_2 is installed in expansion space 240_2 while expansion space 240_1 is empty, and therefore fluid couplings 100_3 and 100_4 are in the expansion-absent state and fluid couplings 100_1 and 100_2 are in the expansion-present state, which means that liquid flows from supply portion 204*a* into expansion loop 244_1 via coupling 100_1, back into additional bypass portion 204*d* via coupling 100_2, and then through the bypass portion 204*b*_1 and into the return portion via couplings 100_3 and 100_4.

Turning now to FIGS. 10-19, example fluid couplings 300, 400, and 500 will be described. The fluid couplings 300, 400, and 500 are all example implementations of the fluid coupling 100 described above and illustrated in FIGS. 1-9. The fluid couplings 300, 400, and 500 are each illustrated in association with a complementary fluid coupling 347 which is configured to mate with the fluid coupling 300, 400, and 500. Various components of the fluid couplings 300, 400, and 500 are similar to the components of the fluid coupling 100 described above, and these similar components are given similar reference numbers herein (e.g., numbers having the same last two digits) and duplicative description of aspects of these components already described above may be omitted.

Figure 10:
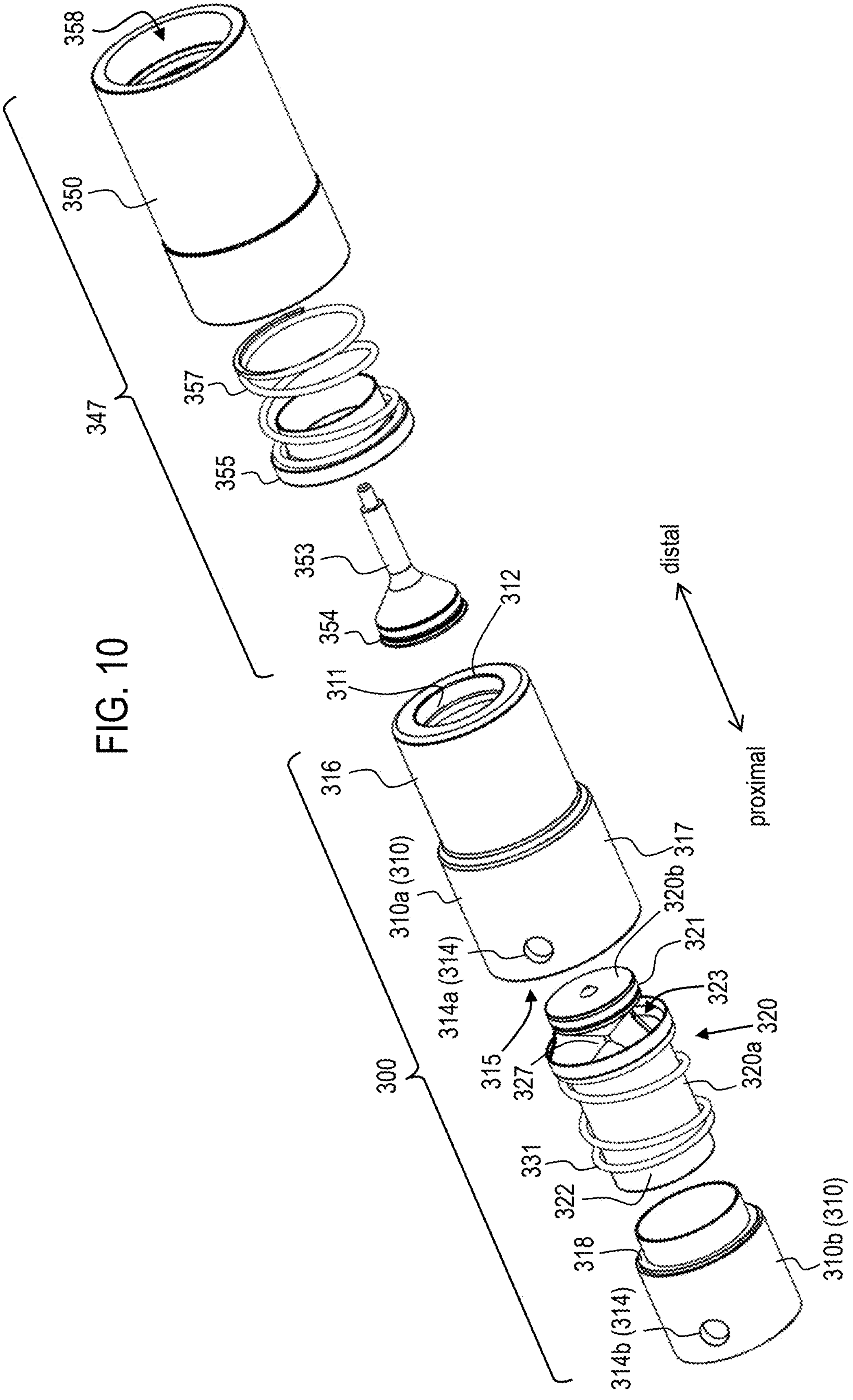
FIG. 10 is a perspective exploded view of an example 3-way fluid coupling and complementary fluid coupling.
Figure 11:
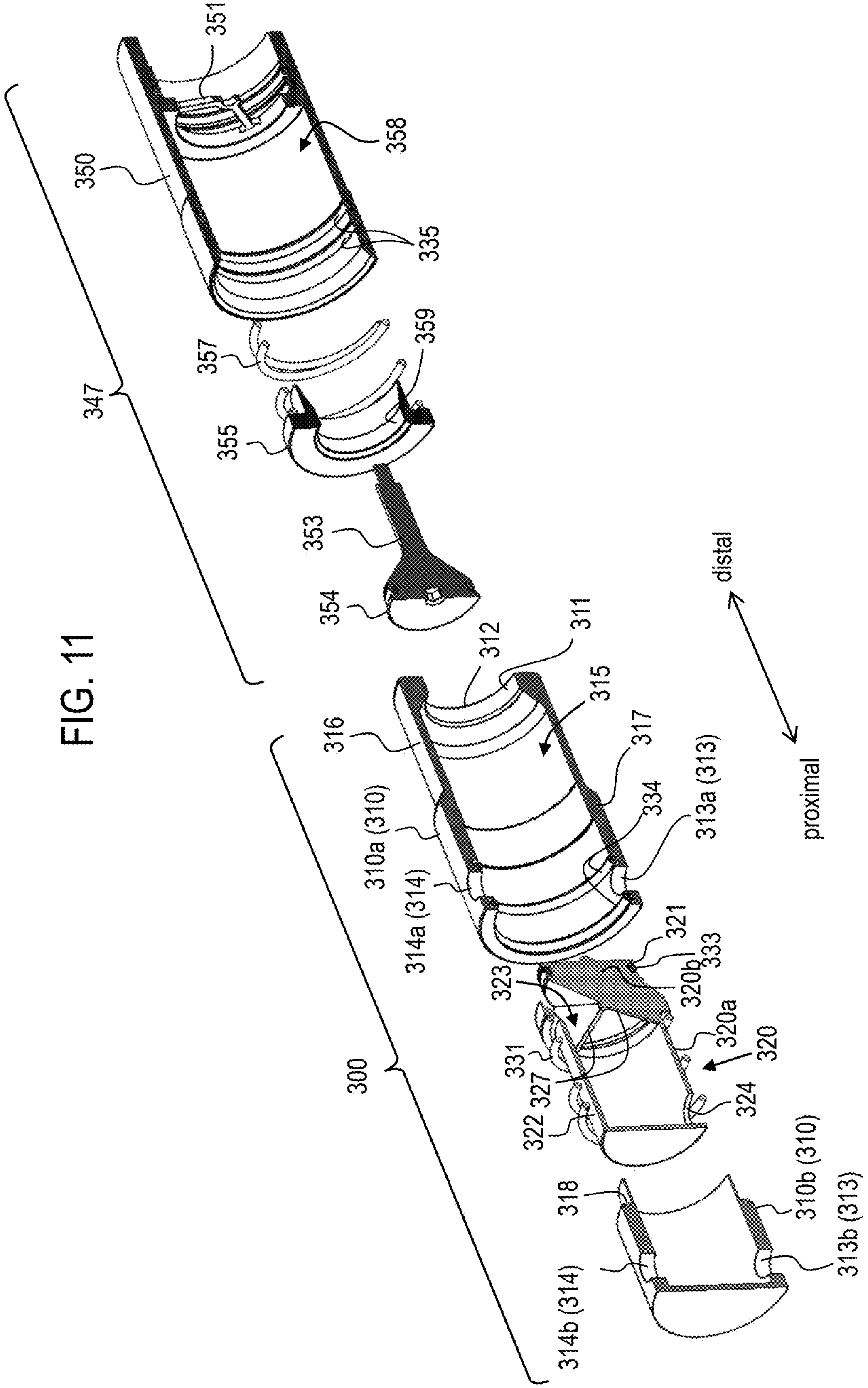
FIG. 11 is a perspective exploded sectional view of the 3-way fluid coupling and complementary fluid coupling of FIG. 10.
Figure 12:
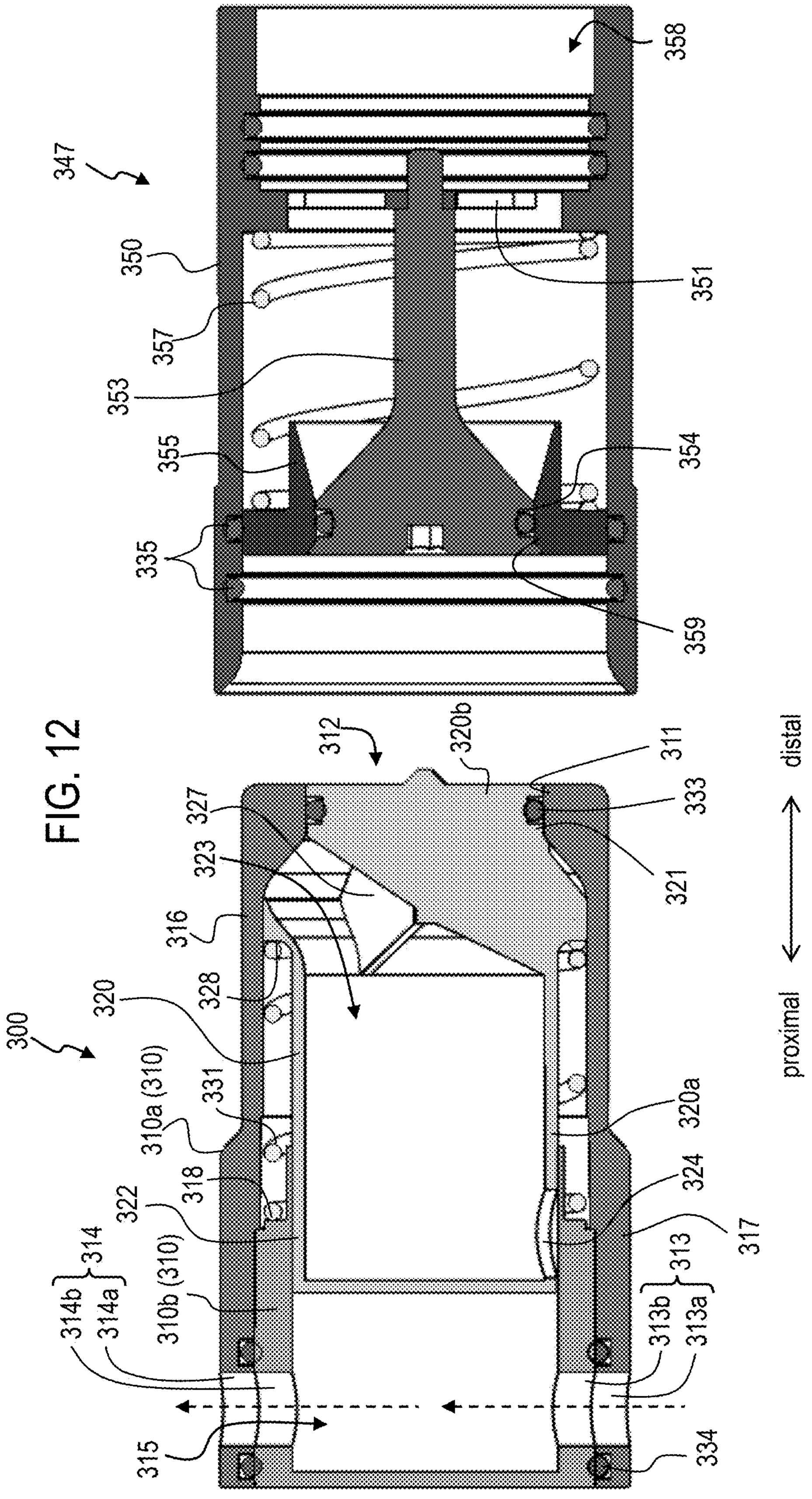
FIG. 12 is a cross-section of the 3-way fluid coupling and complementary fluid coupling of FIG. 10 in a non-mated state.
Figure 13:
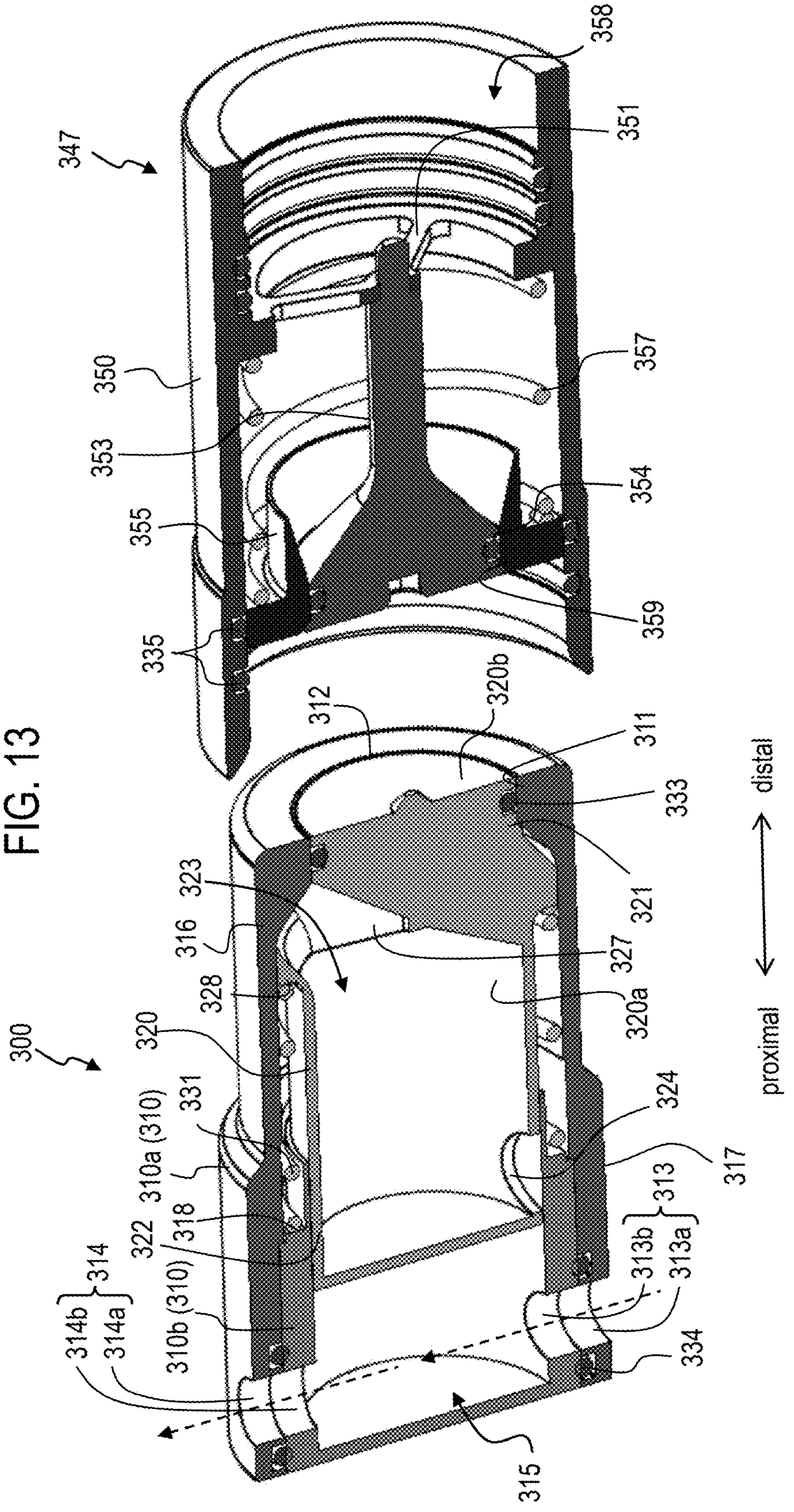
FIG. 13 is a perspective sectional view of the 3-way fluid coupling and complementary fluid coupling of FIG. 10 in the non-mated state.
Figure 14:
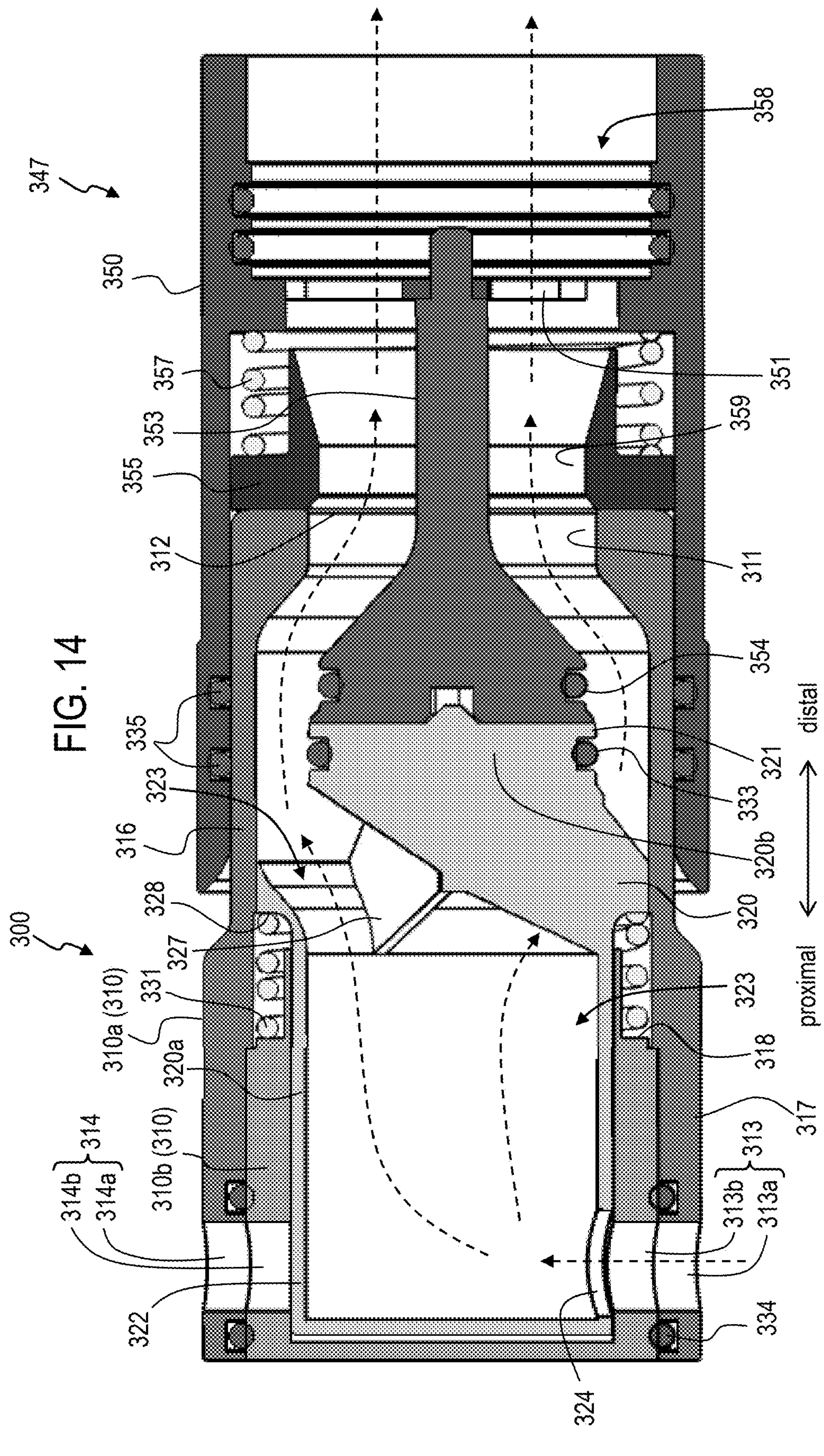
FIG. 14 is a cross-section of the 3-way fluid coupling and complementary fluid coupling of FIG. 10 in a mated state.
Figure 15:
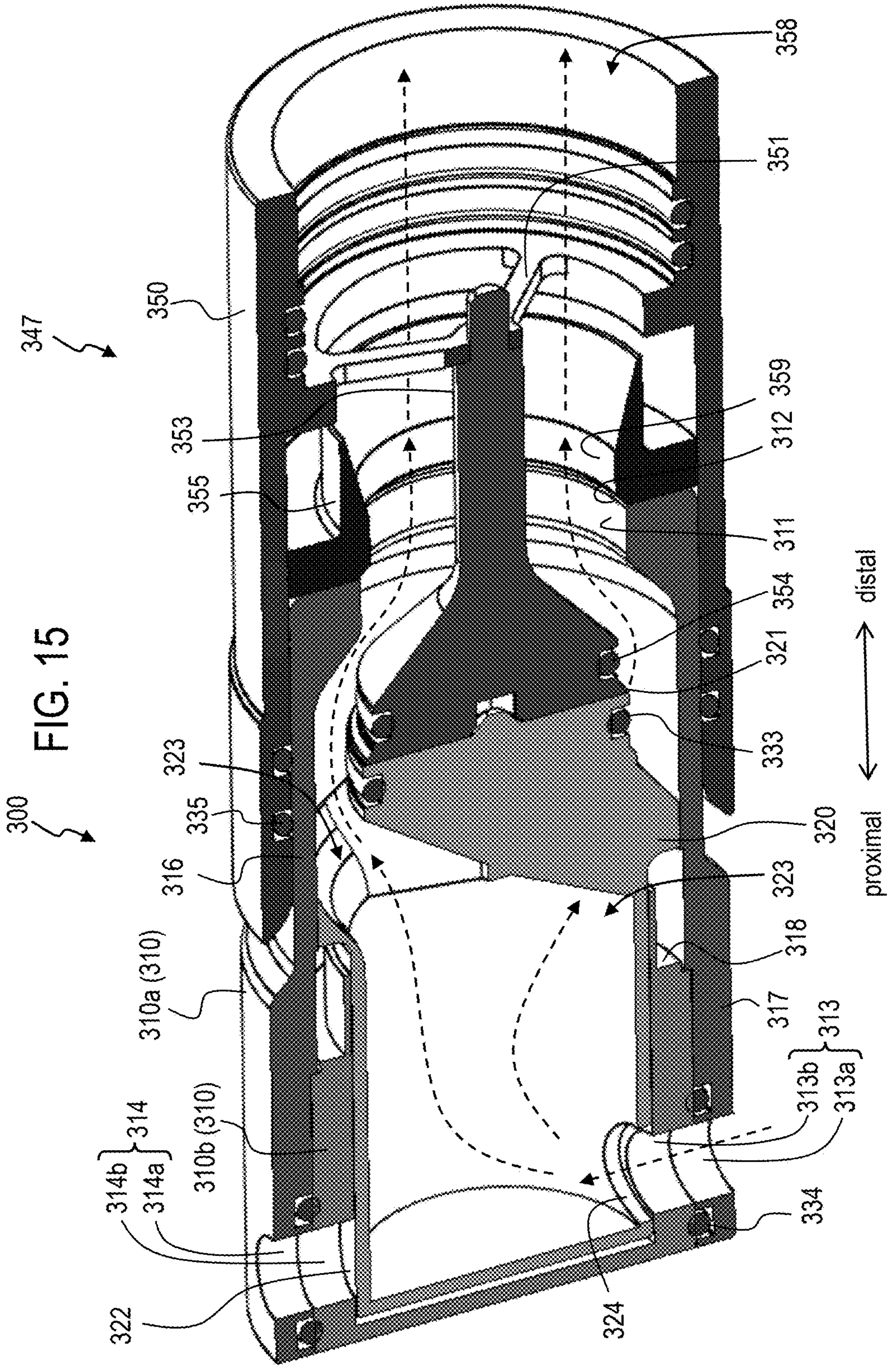
FIG. 15 is a perspective sectional view of the 3-way fluid coupling and complementary fluid coupling of FIG. 10 in the mated state.

FIGS. 10-15 illustrate the fluid coupling 300. FIG. 10 comprises an exploded view of the fluid couplings 300 and 347. FIG. 11 comprises an exploded sectional view of the fluid couplings 300 and 347. FIG. 12 comprises a cross-section of the fluid couplings 300 and 347 in a non-mated state. FIG. 13 comprises a perspective sectional view of the fluid couplings 300 and 347 in the non-mated state. FIG. 14 comprises a cross-section of the fluid couplings 300 and 347 in a mated state. FIG. 15 comprises a perspective sectional view of the fluid couplings 300 and 347 in the mated state. All of the sections are taken along a longitudinal axis of the fluid couplings 300 and 347 (the longitudinal axis being parallel to the proximal-distal axis shown in FIGS. 10-15).

As shown in FIGS. 10-15, the fluid coupling 300 comprises a body 310 which is formed from two main parts: an outer body 310*a* and an inner body 310*b*. The fluid coupling 300 further comprises a poppet 320 and a spring 321, which are disposed in the body 310. These components will be described in greater detail in turn below.

The outer body 310*a* has a generally tube-like (hollow cylinder) shape with a distal end portion 316 and a proximal end portion 317, and a bore extending along the longitudinal axis thereof. Prior to assembly, the bore of the outer body 310*a* is open at both proximal and distal ends thereof. The inner body 310*b* also has a generally tube-like shape with a bore which is open at a distal end thereof but closed at a proximal end thereof. As shown in FIG. 12, the inner body 310*b* is inserted into a proximal end portion 317 of the outer body 310*a* via the opening in the proximal end of the bore of the outer body 310*a*, and when so assembled the bores of the inner and outer bodies 310*a* and 310*b* together form the interior space 315 of the body 310. The bottom surface of the inner body 310*b* closes off the proximal opening of the bore of the outer body 310*a*. The inner body 310*b* and the outer body 310*a* may be attached together, for example by mechanical fastening (e.g., threads, a friction fit, a fastener), welding, adhesive, or any other fastening technique. A liquid tight seal may also be established between the inner body 310*b* and the outer body 310*a* to prevent liquid from escaping from the interior space 315 through the gap between the inner body 310*b* and the outer body 310*a*. In some examples, one or more sealing elements 334 (e.g., O-rings) may be disposed between the inner and outer bodies 310*a* and 310*b* to aid in creating this liquid tight seal. In the illustrated example, two such sealing elements 334 are shown and are coupled to the outer body 310*a* in grooves in an inner surface thereof, but in other examples sealing elements could be coupled to the inner body 310*b* in grooves in an outer surface thereof.

As shown in FIGS. 10-12, the outer body 310*a* comprises a first aperture 313*a* and a second aperture 314*a* in a circumferential wall thereof. Similarly, the inner body 310*b* comprises a first aperture 313*b* and a second aperture 314*b* in a circumferential wall thereof. As shown in FIG. 12, the first apertures 313*a* and 313*b* are aligned with one another in the assembled state and together form the first port 313, which allows for communication between the interior space 315 and an external space. Similarly, the second apertures 314*a* and 314*b* are aligned with one another in the assembled state and together form the second port 314, which allows for communication between the interior space 315 and an external space. The ports 313 and 314 may be physically and fluidically connected to tubes/pipe or other liquid cooling infrastructure of a primary loop of an information processing devices via connectors (not illustrated), as described above in relation to ports 113 and 114.

As noted above, a distal end of the bore of the outer body 310*a* is open, and this opening forms the third port 312. This third port 312 is fluidically coupled to the interior space 315. In addition, the port 312 may be fluidically connected to an interior volume 358 of the complementary fluid coupling 347 when the fluid couplings 300 and 347 are mated, as described above in relation to port 112 and as shown in FIGS. 14 and 15. At the port 312, the outer body 310*a* comprises body seal interface 311. The body seal interface 311 comprises a radially-inward protrusion (ring) protruding from an inner surface of the body 310*a*. This body seal interface 311 is configured to engage with the poppet 320 and cooperate therewith to seal off the port 312, as will be described in greater detail below.

As shown in FIGS. 10-15, the poppet 320 is disposed within body 310 in the interior space 315. As can be seen in FIGS. 10 and 11, the poppet 320 has proximal end portion 320*a* with the general shape of a hollow cylinder and a distal end portion 320*b* which has a poppet seal interface 321. The proximal end portion 230*a* of poppet 320 further comprises an aperture 324 in a circumferential wall thereof. A poppet channel 323 extends through the poppet 320 to communicably connect the aperture 324 with the space radially surrounding the distal end portion 320*b* of the poppet 320. The poppet channel 323 includes the hollow interior space inside the proximal end portion 320*a* of the poppet 320 as well as one or more apertures or channels connecting this hollow interior space to the space surrounding the distal end portion 320*b* and the poppet seal interface 321. Specifically, the poppet channel 323 communicably connects the aperture 324 with port 312, in certain states, as described in greater detail below. The proximal end portion 320*a* is connected to the distal end portion 320*b* by support members 327 which have apertures which form part of the poppet channel 323. Poppet 320 also comprises a port blocker 322 in the proximal portion 320*a*. In this example, the port blocker 322 is formed by a portion of the circumferential wall of the distal portion 320*a* which engages with an inner surface of the body 310 to block the second port 314 in certain states.

During assembly, the poppet 320 and spring 331 are inserted into bore of the outer body 310*a* prior to the insertion of inner body 310*b*, and then once the inner body 310*b* has been inserted into the outer body 310*a* and attached thereto, the poppet 320 is thereafter retained within body 310 in the interior space 315. Specifically, the inner body 310*b* prevents the poppet 320 from exiting the proximal end of the body 310 and the body seal interface 311 prevents the poppet 320 from exiting the distal end of the body 310. In the assembled state, the proximal end of the poppet 320 extends into the bore of the inner body 310*b*. The spring 331 is contained and compressed between the inner body 310*b* and the poppet 320, specifically between a shoulder 318 of the inner body 310*b* and a shoulder 328 of the distal end portion of the poppet 320, as shown in FIG. 12. The spring 331 exerts bias forces on the poppet 320 urging the poppet 320 to move in the distal direction relative to the body 310.

As can be seen by comparing FIG. 12 to FIG. 14 (or FIG. 13 to FIG. 15), the poppet 320 is moveable relative to body 310 within the interior space 315 between a first position (FIGS. 12 and 13) and a second position (FIGS. 14 and 15). In the first position (FIGS. 12 and 13), the poppet 320 is at its most distal position and the poppet seal interface 321 is engaged with the body seal interface 311, creating a liquid tight seal which seals off the distal end of the interior space 315, blocking the flow of liquid through port 312. The first position is the default position of the poppet 320 when the fluid couplings 300 and 347 are not mated. The first position corresponds to the expansion-absent state and in this state liquid can flow between first and second ports 313 and 314, passing through interior space 315, as indicated by the dashed lines in FIGS. 12 and 13, but the liquid is prevented from flowing through third port 312. (Fluid can also flow in an opposite direction along the path indicated by the dashed lines, depending on how the fluid coupling 300 is coupled to the primary loop). In some examples, one or more sealing members 333 (e.g., O-rings) may be disposed between the body seal interface 311 and the poppet seal interface 321 to aid in the creation of the watertight seal. In the illustrated example, a sealing member 333 is attached to the poppet seal interface 321, but in other examples a sealing member could be attached to the body seal interface 311 and in still other examples additional sealing members could be used.

In the second position (FIGS. 14 and 15), the poppet 320 is proximal of the first position and the poppet seal interface 321 is disengaged from the body seal interface 311, thus opening the third port 312. In addition, in the second position the aperture 324 is aligned with the first port 313 while the port blocker 322 is aligned with second port 314. Thus, in this state, the first port 313 is open and communicably connected with the poppet channel 323 which is in turn fluidically coupled to the open third port 312, while the second port 314 is closed (blocked by port blocker 322) and fluid communication therethrough is substantially prevented. The second position of the poppet 320 occurs when the fluid couplings 300 and 347 are mated, as described further below. The second position corresponds to the expansion-present state and in this state liquid can flow between first and third ports 313 and 312 (via poppet channel 323 and interior space 315), as indicated by the dashed lines in FIGS. 12 and 13, but the liquid is substantially prevented from flowing through second port 314. (Fluid can also flow in an opposite direction along the path indicated by the dashed lines, depending on how the fluid coupling 300 is coupled to the primary loop).

As noted above, the second position of the poppet 320 occurs when the fluid couplings 300 and 347 are mated. As shown in FIGS. 10-15, the fluid coupling 347 comprises a body 350 with a central bore through the body 350 defining an interior volume 358. In the interior volume 358 is disposed a plunger 353 and a poppet 355. The plunger 353 is attached to the body 350 via attachment portion 351, which has a spoke-and-hub like configuration. Poppet 355 can move within body 350 between proximal and distal positions illustrated in FIGS. 12 and 14, respectively. A spring 357 is contained between poppet 355 and body 350 and biases the poppet 355 towards the proximal position. The poppet 355 and spring 357 may be inserted into the body 350 first, then plunger 353 may be inserted and attached to attachment portion 351. Thereafter, plunger 355 retains the poppet 355 in the body 350. The poppet 355 has a central aperture through which plunger 355 extends, but a proximal end of plunger 355 may have a larger diameter than this aperture and thus the plunger 355 prevents the poppet 355 from moving proximally past the plunger 353. Poppet 355 has a first seal interface 359 in an inner circumferential surface thereof around the aperture of the poppet 355 and plunger 353 has a second seal interface 354 in an outer circumferential surface thereof which engage one another to seal off the aperture in the poppet 355. One or more sealing members (e.g., O-rings) may be provided at these interfaces to aid in establishing a liquid-tight seal. The outer circumferential surface of the poppet 355 is also sealed liquid tight relative to the body 350 when in the proximal position by one or more sealing members 335.

As shown in FIGS. 14 and 15, when the fluid couplings 300 and 347 are mated, the distal end portion 316 of the fluid coupling 300 is inserted into the interior volume 358 of the fluid coupling 347. This is achieved by aligning the fluid couplings 300 and 347 and moving them towards one another, with the distal end portion 316 moving distally relative to the body 350 (or, equivalently, the body 350 moving proximally relative to the distal end portion 316). Lead-in features (e.g., chamfers) in fluid couplings 300 and 347 may assist in guiding the distal end portion 316 into the bore of the body 350. As the distal end portion 316 is moved distally into the fluid coupling 347 (or, equivalently, as the fluid coupling 347 is moved proximally onto the distal end portion 316), the distal end portion 316 contacts and pushes against the poppet 355, moving the poppet 355 distally and compressing spring 357. This disengages the sealing interfaces 354 and 359, thus opening the aperture in the poppet 355 and allowing liquid to flow therethrough. At the same time that the distal end portion 316 is moving the poppet 355 distally, the plunger 353 pushes against the poppet 320 and moves the poppet 320 proximally, compressing spring 331. This disengages the sealing interfaces 321 and 311, thus opening the third port 312 and allowing liquid to flow therethrough. This motion is continued until the poppet 320 reaches the second position (FIGS. 14 and 15), whereupon the mating sequence is complete. In this state, the sealing members 335 create a liquid tight seal between the outer surface of the distal end portion 316 and the inner surface of the body 350, the port 312 is open, and the aperture in the poppet 355 is open. Thus, in this state, liquid can flow between the first port 313 and the interior volume 358 of the fluid coupling 347 (and from there into the expansion loop coupled to fluid coupling 347). In some examples, latching features (not illustrated) may be used to secure the fluid couplings 300 and 347 in the mated state, resisting the spring forces and liquid pressure which would otherwise urge the fluid couplings 300 and 347 apart. Such latching features are commonly used in QD fluid couplings and would be familiar to those of ordinary skill in the art.

Figure 16:
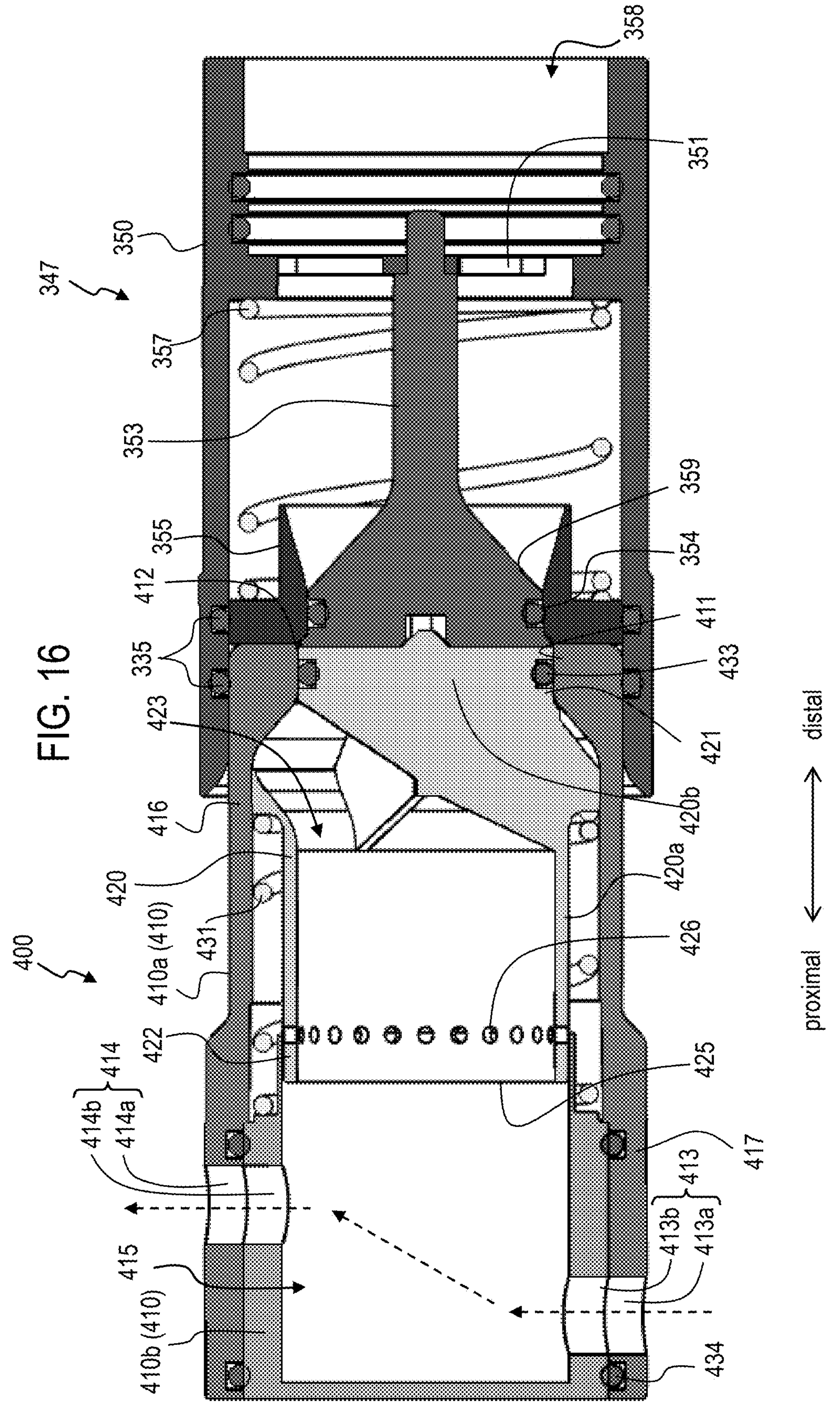
FIG. 16 is a cross-section of another example 3-way fluid coupling and complementary fluid coupling in a non-mated state.
Figure 17:
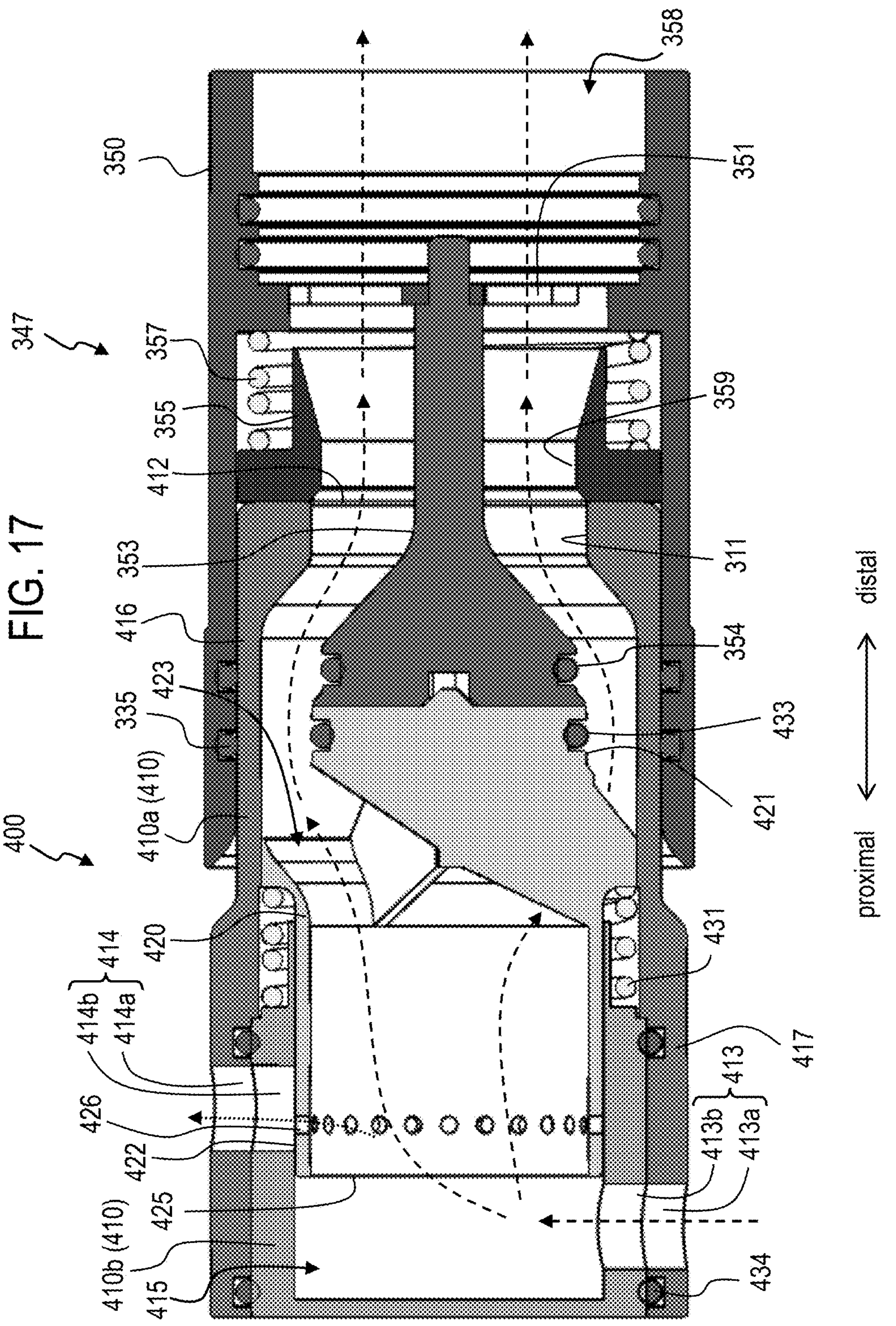
FIG. 17 is a cross-section of the 3-way fluid coupling and complementary fluid coupling of FIG. 16 in a mated state.

Turning to FIGS. 16 and 17, example fluid coupling 400 will be described. FIG. 16 illustrates the fluid coupling 400 in a non-mated state with the fluid coupling 347, whereas FIG. 17 illustrates the fluid coupling 400 in a mated state with the fluid coupling 347. Fluid coupling 400 may be similar to fluid coupling 300 except for the differences noted below and shown in the figures, and thus the descriptions of components of the fluid coupling 300 above may be applied to the similar components of the fluid coupling 400 (which are given reference numbers having the same last two digits) unless otherwise noted or unless doing so would be logically contradictory.

The fluid coupling 400 comprises a body 410, poppet 420, and spring 431. The body 410 comprises an outer body 410*a* and an inner body 410*b*, similar to the body 310 described above. The outer body 410*a* comprises a distal portion 416 and proximal portion 417, similar to body 310*a*. The outer body 410*a* and inner body 410*b* comprise first apertures 413*a* and 413*b* which are aligned and form first port 413, and second apertures 414*a* and 414*b* which are aligned and form second port 414. Unlike the second port 314 which was at approximately the same location along a proximal-distal axis as the first port 313, the second port 414 is offset distally relative to the first port 413.

The poppet 420 comprises a proximal end portion 420*a* and a distal end portion 420*b* with a poppet sealing interface 421. The outer body 410*a* comprises body sealing interface 411, which is configured to engage with the poppet sealing interface 421 to create a liquid tight seal, similar to poppet sealing interface 321 and body sealing interface 321. Sealing members 433 and 434 may also be used, similar to sealing members 333 and 334. Poppet 420 may also comprise poppet channel 423 which may be similar to poppet channel 323. Poppet 422 also comprises port blocker 422, which is similar to port blocker 322.

Poppet 420 may differ from poppet 320 in that the proximal end portion 420*a* of the poppet 420 comprises an aperture 425 in a proximal end thereof instead of the aperture 324 of the poppet 320. The aperture 425 faces proximally (axially), in contrast to the aperture 324 which faces laterally (radially). The configuration of the aperture 425 allows for fluid communication to be established between the first port 413 and the aperture 425 without requiring alignment therebetween (see FIG. 17). In contrast, with the poppet 320, in order for fluid communication to be established between the aperture 324 and the port 313, the aperture 324 needed to be aligned with the port 313. To achieve this alignment may require the ability to control the rotational orientation of the poppet 320 relative to the body 310. In contrast, with the poppet 420 this requirement for alignment is eliminated, which allows for easier assembly and/or looser tolerances, which can save costs.

In some examples, proximal end portion 420*a* of poppet 420 also comprises calibrated leak holes 426. As shown in FIG. 17, these leak holes 426 are arranged to align with the second port 414 when the poppet 420 is in the second position. The leak holes 426 are configured to allow a calibrated leak flow to pass through the second port 414 (and thus through the bypass portion coupled thereto) in this state, as indicated by the dotted line in FIG. 17. Providing the leak flow may be beneficial in examples in which the bypass portion cools some components, in which case the leak flow may allow for the continued cooling of these components even when the expansion devices are present. However, in many circumstances, the expansion loop may contain expansion devices that have relatively higher heat output and/or lower heat tolerance than the components cooled by the bypass portion, and therefore it may be desired that the flow rate through the expansion loop be much larger than the flow rate through the bypass portion. Thus, in some examples, the leak holes 426 may be configured to allow a relatively small flow therethrough in comparison to the flow which passes through first port 413. In particular, a desired split of the overall flow between the bypass portion and the expansion loop may be achieved by appropriately sizing the leak holes 426 relative to the sizes of the ports 413 and 412. In some examples, the leak flow may be less than or equal to 10% of the flow through first port 413; in some examples, the leak flow may be less than or equal to 5% of the flow through first port 413; in some examples, the leak flow may be less than or equal to 1% of the flow through first port 413. In some examples, the leak holes 426 have diameters that are less than or equal to 20% the diameter of the port 414.

In the illustrated example, many leak holes 426 are distributed around the circumference of the proximal end portion 420*a* of poppet 420. This is done to ensure that at least one of the leak holes 426 will align with the port 414 regardless of the rotational orientation of the poppet 420. In other examples, a single leak hole 426 could be provided (in which case, control over the rotational orientation of the poppet may be needed in order to ensure alignment with the second port 414). In still other examples, the leak holes 426 may be omitted entirely. Although not shown in FIGS. 10-15, in some examples the poppet 320 of fluid coupling 300 may comprise a leak hole which is arranged to align with the second port 314.

Figure 18:
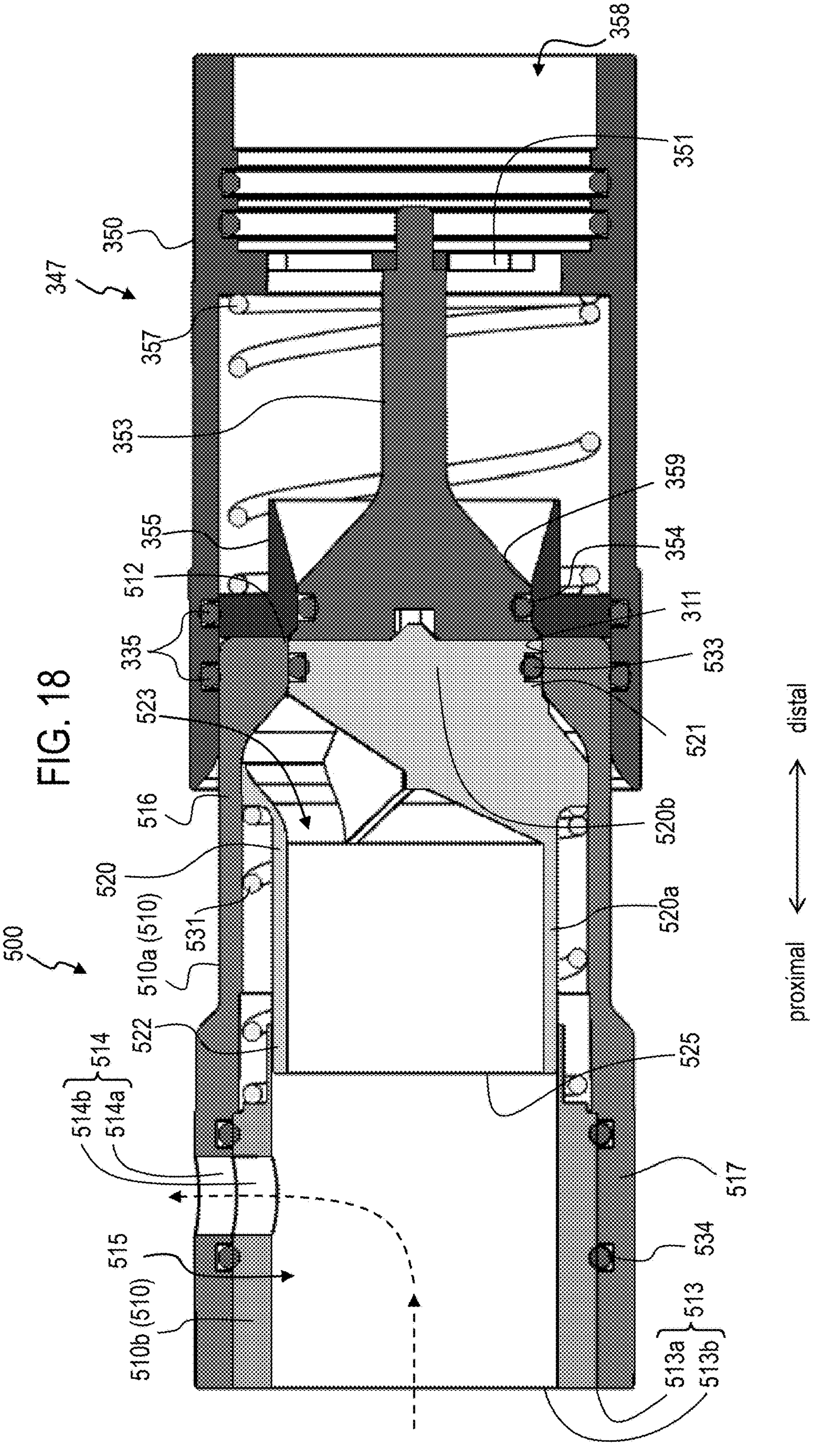
FIG. 18 is a cross-section of another example 3-way fluid coupling and complementary fluid coupling in a non-mated state.
Figure 19:
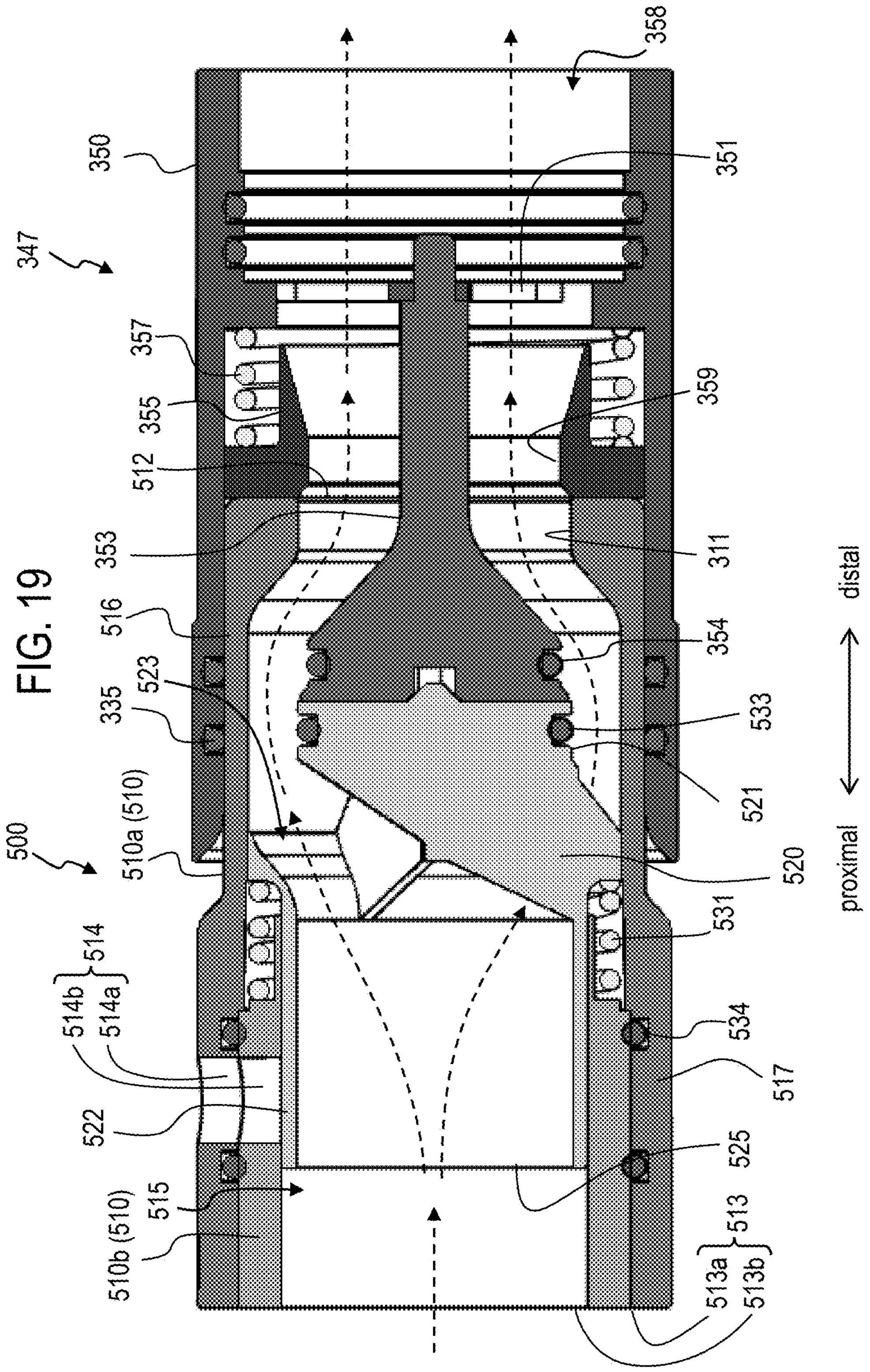
FIG. 19 is a cross-section of the 3-way fluid coupling and complementary fluid coupling of FIG. 18 in a mated state.

Turning to FIGS. 18 and 19, example fluid coupling 500 will be described. FIG. 18 illustrates the fluid coupling 500 in a non-mated state with the fluid coupling 347, whereas FIG. 19 illustrates the fluid coupling 500 in a mated state with the fluid coupling 347. Fluid coupling 500 may be similar to fluid couplings 300 and 400 except for the differences noted below and shown in the figures, and thus the descriptions of components of the fluid couplings 300 and 400 above may be applied to the similar components of the fluid coupling 500 (which are given reference numbers having the same last two digits) unless otherwise noted or unless doing so would be logically contradictory.

The fluid coupling 500 comprises a body 510, poppet 520, and spring 531. The body 510 comprises an outer body 510*a* and an inner body 510*b*, similar to the body 310 described above. The outer body 510*a* comprises distal portion 516, proximal portion 517, similar to body 310*a*. The outer body 510*a* and inner body 510*b* comprise first apertures 513*a* and 513*b* which are aligned and form first port 513, and second apertures 514*a* and 514*b* which are aligned and form second port 514. Unlike the first port 313 which was located in the circumferential wall of body 310, the first port 513 is located at the proximal end of the body 310 (i.e., the apertures 513*a* and 513*b* are located at the proximal ends of the outer and inner bodies 510*a* and 510*b*). The arrangement of the first port 513 allows for a right-angled (90 degree) turn in the primary loop to be made in the fluid coupling 500 itself rather than via an external fitting (such as a 90 degree elbow fitting), which may make certain loop configurations easier to achieve, allow for the reduction in the size of the loop, and/or save costs.

The poppet 520 comprises a proximal end portion 520*a*, and a distal end portion 520*b* with a poppet sealing interface 521. The outer body 510*a* comprises body sealing interface 511, which is configured to engage with the poppet sealing interface 521 to create a liquid tight seal, similar to poppet sealing interface 321 and body sealing interface 321. Sealing members 533 and 534 may also be used, similar to sealing members 333 and 334. Poppet 520 may also comprise poppet channel 523 which may be similar to poppet channel 323. Poppet 522 also comprises port blocker 522, which is similar to port blocker 322.

Poppet 520 may differ from poppet 320 in that proximal end portion 520*a* of poppet 520 comprises an aperture 525 in a proximal end thereof instead of the aperture 324 of the poppet 320. The aperture 525 may be similar to aperture 425.

In the illustrated examples, the poppet 520 or fluid coupling 500 lacks leak holes. In other examples (not illustrated), the poppet 520 of fluid coupling 500 may include one or more calibrated leak holes, similar to the leak holes 426 described above.

Any of the fluid couplings 300, 400, and/or 500 may be used in the information processing devices 101 or 201 described above. Moreover, the fluid couplings 300, 400, and/or 500 could be mixed in various combinations as desired. For example, the fluid coupling 500 with integrated 90-degree bend may be used as the outermost fluid couplings 100_1 and 100_4 in information processing device 201 (to simplify the connections to the supply portion 204*a* and the return portion 204*c*, save space, and eliminate the need for using 90-degree elbow fittings), whereas the fluid couplings 300 or 400 may be used as the inner fluid couplings 100_2 and 100_3. As another example, supposing that bypass path 204*b*_1 needs to cool components but bypass path 204*b*_2 does not, then fluid couplings 300, 400, or 500 with calibrated leak holes may be used as fluid couplings 100_1 and 100_2 while fluid couplings 300, 400, or 500 without calibrated leak holes may be used as fluid couplings 100_3 and 100_4.

References herein to "blocking" a port, or similar references, should be understood as meaning covering at least part of the port such that the flow of liquid therethrough is substantially reduced relative to an unblocked state, wherein "substantially reduced" means that the flow through the port in the blocked state has a flow rate less than or equal to 30% of the flow rate through the port when unblocked, all other things being equal.

In the description above, various types of electronic circuitry are described. As used herein, "electronic" is intended to be understood broadly to include all types of circuitry utilizing electricity, including digital and analog circuitry, direct current (DC) and alternating current (AC) circuitry, and circuitry for converting electricity into another form of energy and circuitry for using electricity to perform other functions. In other words, as used herein there is no distinction between "electronic" circuitry and "electrical" circuitry.

It is to be understood that both the general description and the detailed description provide examples that are explanatory in nature and are intended to provide an understanding of the present disclosure without limiting the scope of the present disclosure. Various mechanical, compositional, structural, electronic, and operational changes may be made without departing from the scope of this description and the claims. In some instances, well-known circuits, structures, and techniques have not been shown or described in detail in order not to obscure the examples. Like numbers in two or more figures represent the same or similar elements.

In addition, the singular forms "a", "an", and "the" are intended to include the plural forms as well, unless the context indicates otherwise. Moreover, the terms "comprises", "comprising", "includes", and the like specify the presence of stated features, steps, operations, elements, and/or components but do not preclude the presence or addition of one or more other features, steps, operations, elements, components, and/or groups. Components described as coupled may be electronically or mechanically directly coupled, or they may be indirectly coupled via one or more intermediate components, unless specifically noted otherwise. Mathematical and geometric terms are not necessarily intended to be used in accordance with their strict definitions unless the context of the description indicates otherwise, because a person having ordinary skill in the art would understand that, for example, a substantially similar element that functions in a substantially similar way could easily fall within the scope of a descriptive term even though the term also has a strict definition.

And/or: Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Elements and their associated aspects that are described in detail with reference to one example may, whenever practical, be included in other examples in which they are not specifically shown or described. For example, if an element is described in detail with reference to one example and is not described with reference to a second example, the element may nevertheless be claimed as included in the second example.

Unless otherwise noted herein or implied by the context, when terms of approximation such as "substantially," "approximately," "about," "around," "roughly," and the like, are used, this should be understood as meaning that mathematical exactitude is not required and that instead a range of variation is being referred to that includes but is not strictly limited to the stated value, property, or relationship. In particular, in addition to any ranges explicitly stated herein (if any), the range of variation implied by the usage of such a term of approximation includes at least any inconsequential variations and also those variations that are typical in the relevant art for the type of item in question due to manufacturing or other tolerances. In any case, the range of variation may include at least values that are within ±1% of the stated value, property, or relationship unless indicated otherwise.

Further modifications and alternative examples will be apparent to those of ordinary skill in the art in view of the disclosure herein. For example, the devices and methods may include additional components or steps that were omitted from the diagrams and description for clarity of operation. Accordingly, this description is to be construed as illustrative only and is for the purpose of teaching those skilled in the art the general manner of carrying out the present teachings. It is to be understood that the various examples shown and described herein are to be taken as exemplary. Elements and materials, and arrangements of those elements and materials, may be substituted for those illustrated and described herein, parts and processes may be reversed, and certain features of the present teachings may be utilized independently, all as would be apparent to one skilled in the art after having the benefit of the description herein. Changes may be made in the elements described herein without departing from the scope of the present teachings and following claims.

It is to be understood that the particular examples set forth herein are non-limiting, and modifications to structure, dimensions, materials, and methodologies may be made without departing from the scope of the present teachings.

Other examples in accordance with the present disclosure will be apparent to those skilled in the art from consideration of the specification and practice of the invention disclosed herein. It is intended that the specification and examples be considered as exemplary only, with the following claims being entitled to their fullest breadth, including equivalents, under the applicable law.

What is claimed is:

1. An information processing device comprising:
a chassis;
a primary space in the chassis and one or more primary electronic components disposed in the primary space;
a primary liquid cooling loop disposed in the primary space and configured to circulate liquid coolant to cool the one or more primary electronic components, the primary liquid cooling loop comprising a supply portion, a return portion, and a bypass path connecting the supply portion to the return portion, the bypass path comprising one or more bypass portions connected in series;
one or more expansion spaces in the chassis, each expansion space configured to receive a corresponding expansion device and a corresponding expansion loop to cool the expansion device; and
one or more fluid coupling pairs connected to the primary liquid cooling loop and corresponding, respectively, to the one or more expansion spaces, each fluid coupling pair comprising two 3-way fluid couplings;
wherein, for each of the fluid coupling pairs:
the 3-way fluid couplings are configured to automatically switch between an expansion-present state and an expansion-absent state based on whether an expansion loop is installed in the corresponding expansion space and complementary fluid couplings of the expansion loop are mated with the 3-way fluid couplings;
in the expansion-absent state, the 3-way fluid couplings direct liquid coolant to flow through a corresponding one of the bypass portions which extends between the 3-way fluid couplings; and
in the expansion-present state, the 3-way fluid couplings direct liquid coolant to flow through the expansion loop and block the corresponding bypass portion.

2. The information processing device of claim 1,
wherein the primary electronic components comprise a primary system board and one or more processors mounted to the primary system board.

3. The information processing device of claim 1,
an expansion module installed in one of the expansion spaces, wherein the expansion module comprises one or more of the expansion devices and one of the expansion loops integrated together as a module.

4. The information processing device of claim 1,
wherein the one or more expansion spaces comprise a plurality of expansion spaces and the one or more fluid coupling pairs comprises a plurality of fluid coupling pairs, wherein each of the fluid coupling pairs is connected to an adjacent one of the fluid coupling pairs by one of the bypass portions.

5. The information processing device of claim 1,
wherein the one or more fluid coupling pairs comprise a first fluid coupling pair comprising a first 3-way fluid coupling and a second 3-way fluid coupling;
wherein the first 3-way fluid coupling comprises a first port coupled to the supply portion, a second port coupled to a first bypass portion of the one or more bypass portions, and a third port;
wherein the second 3-way fluid coupling comprises a first port coupled to the return portion or to a second bypass portion of the one or more bypass portions, a second port coupled to the first bypass portion, and a third port;
wherein, in the expansion-absent state, the first and second 3-way fluid couplings block their respective third ports and fluidically connect their respective first ports to their respective second ports; and
wherein, in the expansion-present state, the first and second 3-way fluid couplings block their respective second ports and fluidically connect their respective first ports to their respective third ports.

6. The information processing device of claim 5,
wherein the first and second 3-way fluid couplings each comprise a body and a poppet disposed in the body, the poppet movable relative to the body between a first position in which the poppet blocks the third port and a second position in which the poppet blocks the second port.

7. A method, comprising:
installing an expansion device in an expansion space of an information processing device, the information processing device comprising a primary space, one or more primary components in the primary space, and a primarily liquid cooling loop in the primary space and configured to circulate liquid coolant to cool the primary components;

installing an expansion loop configured to cool the expansion device in the expansion space and coupling the expansion loop to the primary liquid cooling loop such that the liquid coolant circulates through expansion loop, wherein coupling the expansion loop to the primary liquid cooling loop comprises:

mating a pair of 3-way fluid couplings of the primary liquid cooling loop with a pair of complementary fluid couplings of the expansion loop; and by the mating, causing the pair of 3-way fluid couplings to change from an expansion-absent state to an expansion-present state;

wherein, in the expansion absent state, the 3-way fluid couplings direct the liquid coolant to flow through a bypass portion of the primary liquid cooling loop, the bypass portion extending between the 3-way fluid couplings; and wherein in the expansion-present state, the 3-way fluid couplings direct the liquid coolant to flow through the expansion loop and block the bypass portion.

8. The method of claim 7, wherein mating the pair of 3-way fluid couplings with the pair of complementary fluid couplings causes respective plungers of the complementary fluid couplings to push against and move respective poppets of the 3-way fluid couplings, wherein the moving of the poppets causes the pair of 3-way fluid couplings to change from the expansion-absent state to the expansion-present state.

9. The method of claim 8, wherein mating the pair of 3-way fluid couplings with the pair of complementary fluid couplings comprises moving the 3-way fluid couplings and the complementary fluid couplings together; and wherein the moving of the poppets is caused by the moving of the 3-way fluid couplings and the complementary fluid couplings together without reliance on any additional user input.

* * * * *